US011508757B2

(12) United States Patent
Chiang et al.

(10) Patent No.: US 11,508,757 B2
(45) Date of Patent: Nov. 22, 2022

(54) BREAKDOWN VOLTAGE CAPABILITY OF HIGH VOLTAGE DEVICE

(71) Applicant: Taiwan Semiconductor Manufacturing Co., Ltd., Hsinchu (TW)

(72) Inventors: Hsin-Chih Chiang, Hsinchu (TW); Tung-Yang Lin, New Taipei (TW); Ruey-Hsin Liu, Hsin-Chu (TW); Ming-Ta Lei, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/323,016

(22) Filed: May 18, 2021

(65) Prior Publication Data

US 2022/0223625 A1 Jul. 14, 2022

Related U.S. Application Data

(60) Provisional application No. 63/136,275, filed on Jan. 12, 2021.

(51) Int. Cl.
| | |
|---|---|
| H01L 27/12 | (2006.01) |
| H01L 23/48 | (2006.01) |
| H01L 29/06 | (2006.01) |
| H01L 29/10 | (2006.01) |
| H01L 21/84 | (2006.01) |
| H01L 29/423 | (2006.01) |
| H01L 21/74 | (2006.01) |
| H01L 21/762 | (2006.01) |
| H01L 21/768 | (2006.01) |

(52) U.S. Cl.
CPC ........ H01L 27/1203 (2013.01); H01L 21/743 (2013.01); H01L 21/76283 (2013.01); H01L 21/76898 (2013.01); H01L 21/84 (2013.01); H01L 23/481 (2013.01); H01L 29/0653 (2013.01); H01L 29/1083 (2013.01); H01L 29/1087 (2013.01); H01L 29/4238 (2013.01)

(58) Field of Classification Search
CPC ............... H01L 27/1203; H01L 21/743; H01L 21/78283; H01L 21/76898; H01L 21/84; H01L 23/481; H01L 29/1083
USPC .......................................... 257/347; 438/149
See application file for complete search history.

(56) References Cited

U.S. PATENT DOCUMENTS

2014/0015002 A1* 1/2014 Fonteneau ............ H01L 29/749
257/131

* cited by examiner

Primary Examiner — Thinh T Nguyen
(74) Attorney, Agent, or Firm — Eschweiler & Potashnik, LLC

(57) ABSTRACT

Various embodiments of the present disclosure are directed towards an integrated chip. The integrated chip includes a semiconductor substrate having a device substrate overlying a handle substrate and an insulator layer disposed between the device substrate and the handle substrate. A gate electrode overlies the device substrate between a drain region and a source region. A conductive via extends through the device substrate and the insulator layer to contact the handle substrate. A first isolation structure is disposed within the device substrate and comprises a first isolation segment disposed laterally between the gate electrode and the conductive via. A contact region is disposed within the device substrate between the first isolation segment and the conductive via. A conductive gate electrode directly overlies the first isolation segment and is electrically coupled to the contact region.

20 Claims, 13 Drawing Sheets

US 11,508,757 B2

BREAKDOWN VOLTAGE CAPABILITY OF HIGH VOLTAGE DEVICE

REFERENCE TO RELATED APPLICATION

This Application claims the benefit of U.S. Provisional Application No. 63/136,275, filed on Jan. 12, 2021, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
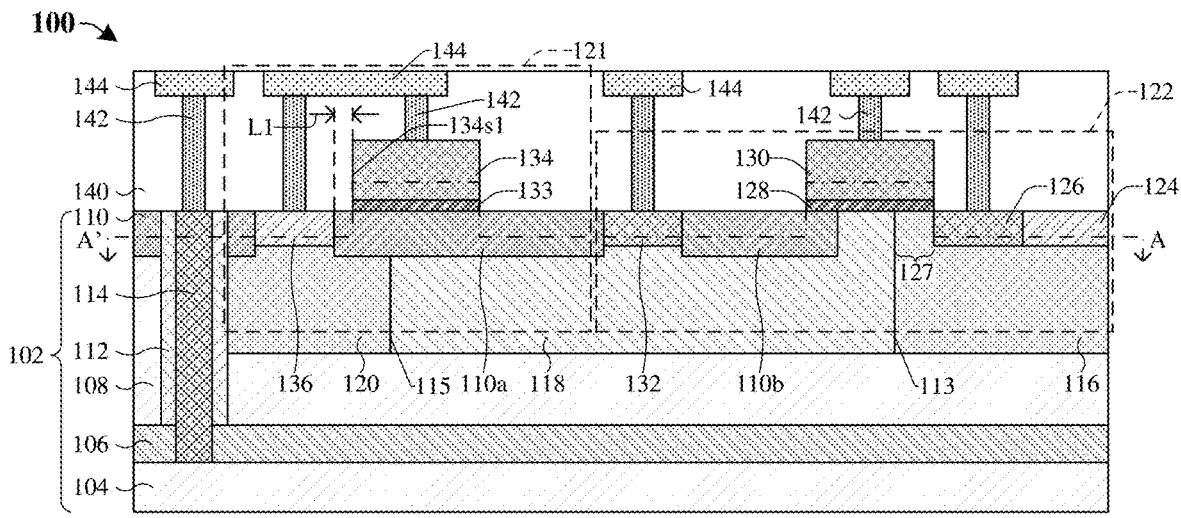
FIG. 1A illustrates a cross-sectional view of some embodiments of an integrated chip comprising a conductive termination structure disposed laterally adjacent to a high voltage transistor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips often comprise transistors that are designed to operate at a number of different voltages. High voltage transistors are design to operate at a high breakdown voltage (e.g., a breakdown voltage of greater than about 20 Volts (V), greater than about 80V, or other suitable values). High voltage transistors may be implemented on a silicon on insulator (SOI) substrate to improve performance such as latch-up free operation, a high packing density, and less leakage current. For example, the SOI substrate may comprise a handle substrate, a device substrate, and an insulator layer disposed between the device substrate and the handle substrate. The high voltage transistor may include a gate structure that is disposed along the device substrate between a source region and a drain region. A first well region comprising a first doping type (e.g., p-type) is disposed within the device substrate under the gate structure and abuts the drain region. A second well region comprising a second doping type (e.g., n-type) is disposed within the device substrate and extends from the first well region to the source region. In addition, a conductive via extends through the device substrate and the insulator layer to contact the handle substrate, the conductive via is configured to bias the handle substrate. During operation, a bias voltage may be applied to the gate structure to generate an electric field that causes a channel region to extend below the gate structure and through the first well region. When the bias voltage is relatively high (e.g., greater than about 60-70V), a high electric field is generated in the device substrate. In an effort to mitigate adverse effects of the high electric field, the handle substrate may be electrically coupled to ground by way of the conductive via. This mitigates negative effects of the high electric field and increases a breakdown voltage of the high voltage transistor.

The conductive via can be formed in a number of different ways. For example, the conductive via may be formed laterally adjacent to the drain region and the first well region such that an isolation structure separates the first well region from the conductive via. In such configurations when applying a high negative voltage bias (e.g., about −60V or more) to the drain region, a high electric field would be present in the device substrate at the drain region and the first well region. However, due to the proximity of the drain region to the conductive via, the high electric field and/or a voltage difference between the conductive via and the drain region may damage the isolation structure and/or the device substrate, thereby resulting in breakdown of the high voltage transistor. Alternatively, the conductive via may be formed laterally adjacent to the source region and the second well region such that an isolation structure separates the second well region from the conductive via. In such configurations when applying a high positive voltage bias (e.g., about +60V or more) to the gate structure and/or the source region, a high electric field would be present in the device substrate at the drain region and the second well region. However, due to the proximity of the source region to the conductive via, the high electric field and/or a voltage difference between the conductive via and the source region may damage the isolation structure and/or the device substrate, thereby resulting in breakdown of the high voltage transistor. Thus, the breakdown voltage of the high voltage transistor may be mitigated based on a layout of the conductive via relative to the source region and/or drain region of the high voltage transistor.

Accordingly, the present disclosure relates to an integrated chip comprising a conductive termination structure configured to increase a breakdown voltage capability of a high voltage transistor. The integrated chip includes a device substrate overlying an insulator layer and a handle substrate underlying the insulator layer. A first well region, a second well region, and a third well region are disposed in the device substrate. The second well region is disposed between the first well region and the third well region. A high voltage transistor is disposed on the device substrate and comprises a gate electrode spaced between a drain region and a source region. The gate electrode overlies a first interface between the first well region and the second well region. Further, a conductive via is disposed within the device substrate and is electrically coupled to the handle substrate. The conductive termination structure is disposed on the handle substrate between the conductive via and the drain region. The conductive termination structure comprises a contact region disposed within the third well region and a conductive gate electrode overlying a second interface between the second well region and the third well region. The conductive gate electrode is electrically coupled to the third well region by way of the contact region. During operation of the high voltage transistor device, electric fields generated by the gate electrode may accumulate at the drain region and/or the second well region. The conductive termination structure is configured to act upon the electric field generated by gate electrode and reduce an electric field strength along a surface of the device substrate (e.g., reduce the electric field strength accumulated at the drain and/or second well region). This mitigates the accumulated electric field from damaging the device substrate and other structures disposed within the device substrate, thereby increasing a breakdown voltage capability of the high voltage transistor.

FIG. 1A illustrates a cross-sectional view of some embodiments of an integrated chip 100 comprising a conductive termination structure 121 disposed laterally adjacent to a high voltage transistor 122.

The integrated chip 100 includes the high voltage transistor 122 disposed on a semiconductor substrate 102. In various embodiments, the semiconductor substrate 102 is configured as a silicon on insulator (SOI) substrate and comprises a handle substrate 104, a device substrate 108, and an insulator layer 106 disposed between the handle substrate 104 and the device substrate 108. A first well region 116, a second well region 118, and a third well region 120 are disposed within the device substrate 108. The second well region 118 is disposed laterally between the first well region 116 and the third well region 120. In various embodiments, the second well region 118 comprises a first doping type (e.g., p-type), and the first and third well regions 116, 120 respectively comprise a second doping type (e.g., n-type) opposite the first doping type. In various embodiments, the first doping type is p-type and the second doping type is n-type, or vice versa. A first isolation structure 110 extends from a top surface of the device substrate 108 to a point below the top surface of the device substrate 108. The first isolation structure 110 comprises a first isolation segment 110a and a second isolation segment 110b. Further, a second isolation structure 112 extends from the top surface of the device substrate 108 to the insulator layer 106. In various embodiments, the first and second isolation structures 110, 112 are configured to electrically isolate devices disposed on and/or within the semiconductor substrate 102 from one another.

Figure 1B:
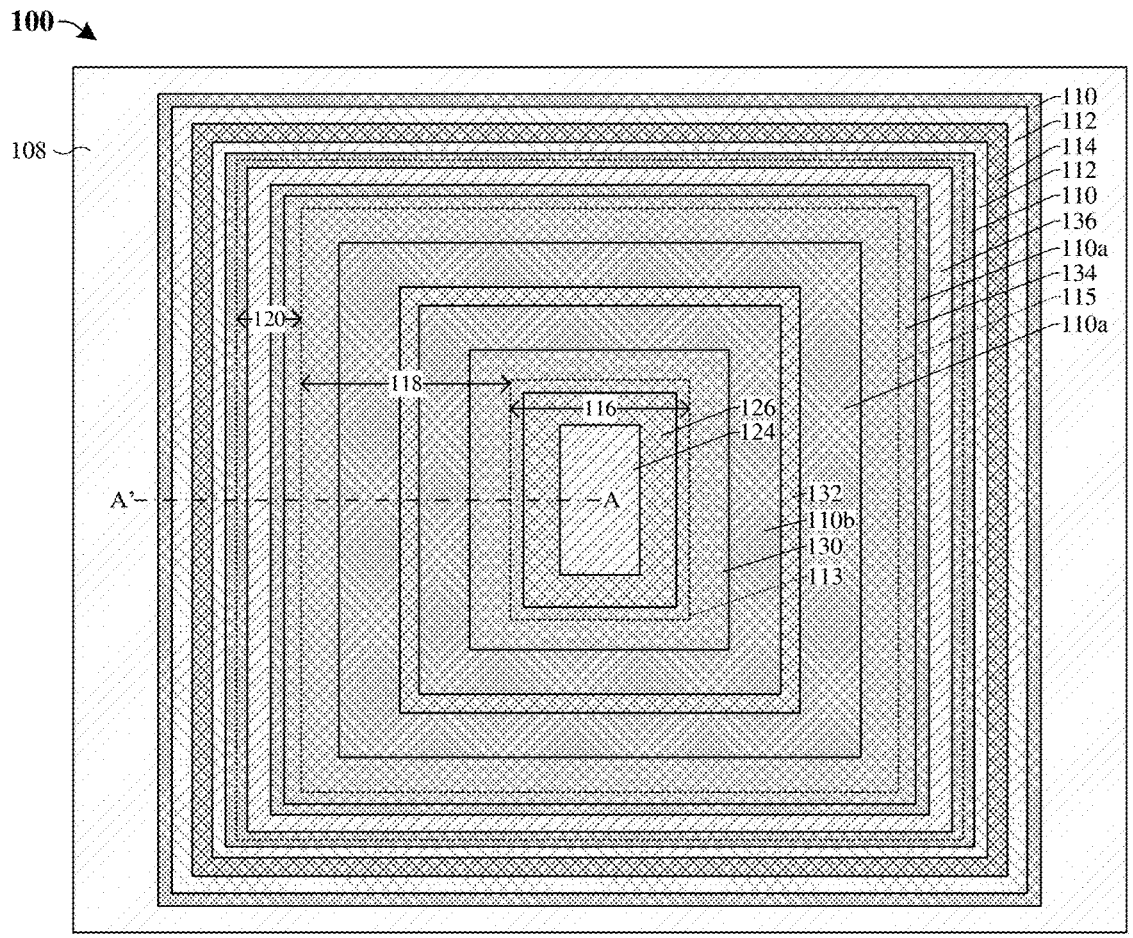
FIG. 1B illustrates a top view of some embodiments of the integrated chip of FIG. 1A.
Figure 1C:
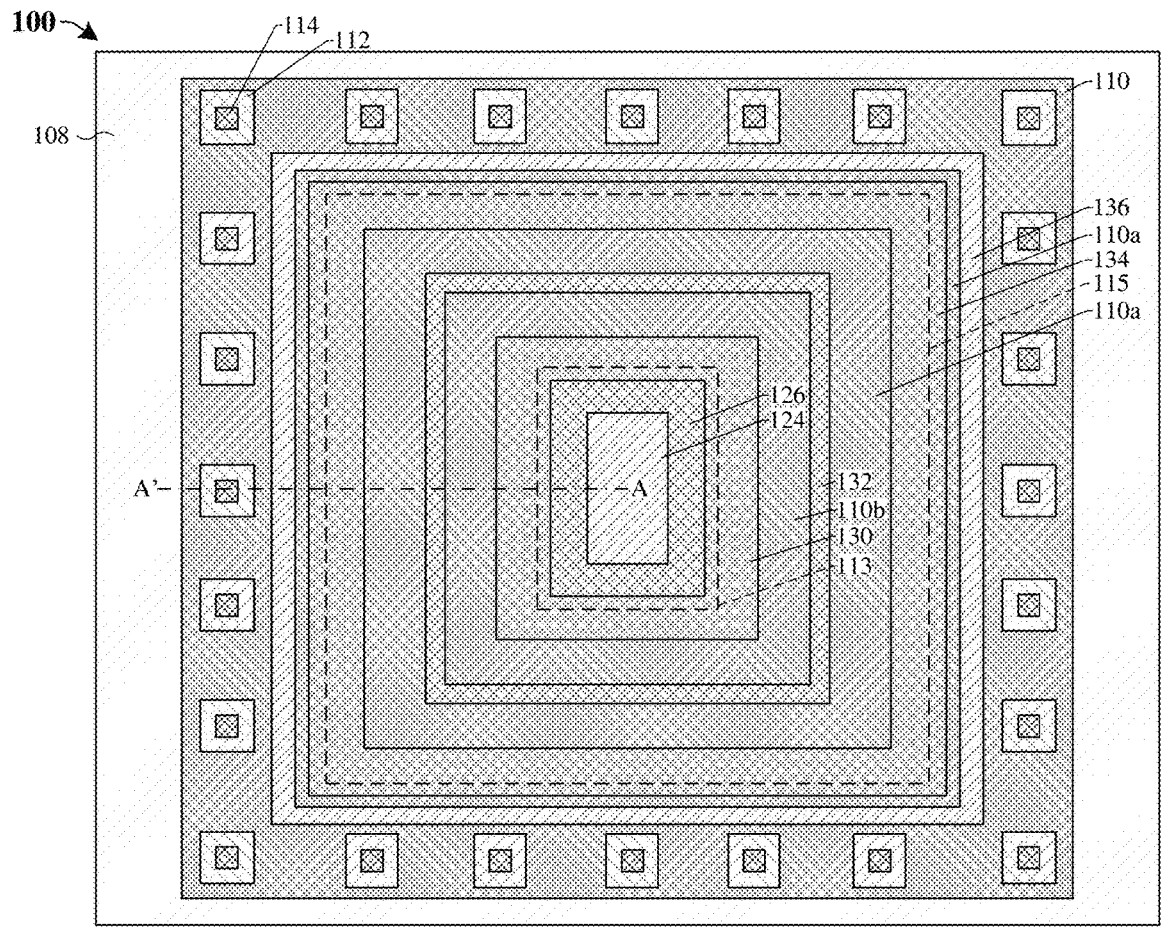
FIG. 1C illustrates a top view of some alternative embodiments of the integrated chip of FIG. 1A.

The high voltage transistor 122 is disposed on the handle substrate 104 such that the high voltage transistor 122 is separated from the handle substrate 104 by the insulator layer 106. In various embodiments, the high voltage transistor 122 comprises a source region 126, a drain region 132, a gate electrode 130, and a gate dielectric layer 128 disposed between the semiconductor substrate 102 and the gate electrode 130. The gate electrode 130 overlies the device substrate 108 and is disposed laterally between the source region 126 and the drain region 132. The source region 126 is disposed within the first well region 116 and is laterally adjacent to a body contact region 124. Further, the drain region 132 is disposed within the second well region 118 and is laterally separated from the source region 126 by the second isolation segment 110b. In various embodiments, the gate electrode 130 directly overlies a portion of the second isolation segment 110b and directly overlies a first interface 113 between the first well region 116 and the second well region 118. In some embodiments, the source region 126 and the drain region 132 respectively comprise the first doping type (e.g., p-type), and the body contact region 124 comprises the second doping type (e.g., n-type). In such embodiments, the high voltage transistor 122 is configured as a p-channel metal-oxide semiconductor (PMOS) transistor, a p-channel laterally diffused metal-oxide semiconductor (p-LDMOS) transistor, or another suitable device. In yet further embodiments, the high voltage transistor 122 may be configured as an n-channel MOS (NMOS) transistor, an n-channel LDMOS (n-LDMOS) transistor, or another suitable device. Further, a conductive via 114 (which may be manifest as a continuous ring surrounding the high voltage transistor, such as shown in FIG. 1B, or may manifest as one or more conductive pillars collectively surrounding the high voltage transistor, such as shown in FIG. 1C) is disposed within the semiconductor substrate 102 and continuously extends from the top surface of the device substrate 108, through the insulator layer 106, to a top surface of the handle substrate 104. The conductive via 114 is separated from the device substrate 108 by the second isolation structure 112 and is configured to bias the handle substrate 104. For example, the conductive via 114 is configured to electrically couple the handle substrate 104 to ground (e.g., 0V), a ground node, a ground terminal, or the like. By coupling the handle substrate 104 to ground by way of the conductive via 114, a stability and breakdown voltage of the high voltage transistor 122 may be improved. In yet further embodiments, the conductive via 114 may be referred to as a guard ring.

An interconnect structure overlies the device substrate 108 and comprises a dielectric structure 140, a plurality of conductive contacts 142, and a plurality of conductive wires 144. The conductive contacts and wires 142, 144 are disposed within the dielectric structure 140 and are configured to provide electrical connections to devices (e.g., the high voltage transistor 122) disposed on the semiconductor substrate 102. In various embodiments, the conductive termination structure 121 is disposed laterally between the high voltage transistor 122 and the conductive via 114. In some embodiments, the conductive termination structure 121 includes the third well region 120, a contact region 136 disposed within the third well region 120, a conductive gate electrode 134, and a peripheral gate dielectric layer 133. The third well region 120 and the contact region 136 respectively comprise the second doping type (e.g., n-type), which is opposite the first doping type (e.g., p-type) of the second well region 118 such that a P-N junction diode structure of the conductive termination structure 121 exists between the second well region 118 and the third well region 120. The P-N junction diode structure of the conductive termination structure 121 is, for example, configured to direct current flow towards the contact region 136. In further embodiments, the contact region 136 is electrically coupled to the conductive gate electrode 134 by way of a conductive wire 144 and conductive contacts 142. The peripheral gate dielectric layer 133 separates the conductive gate electrode 134 from the device substrate 108. Further, the peripheral gate dielectric layer 133 and the conductive gate electrode 134 directly overlie the first isolation segment 110a of the first isolation structure 110. The conductive gate electrode 134 directly overlies a second interface 115 between the second well region 118 and the third well region 120.

In some embodiments, upon receiving a bias voltage, the gate electrode 130 of the high voltage transistor 122 is configured to generate an electric field that controls the movement of charge carriers (e.g., electrons or electron holes) within a channel region 127 laterally disposed between the source region 126 and the drain region 132. For example, during operation, a gate-source voltage can be selectively applied to the gate electrode 130 relative to the source region 126, thereby forming a conductive channel in the channel region 127. Further, while the gate-source voltage is applied to form the conductive channel, a drain to source voltage is applied to move charge carriers between the source region 126 and the drain region 132. In various embodiments, the channel region 127 may laterally extend from the source region 126 to the adjacent second well region 118 (e.g., in some embodiments referred to as a drift region and/or a "drain extension region").

In various embodiments, during operation of the integrated chip 100, the conductive termination structure 121 is configured to act upon the electric field generated by the gate electrode 130. This, in part, enhances the breakdown voltage capability of the high voltage transistor 122 thereby increasing a performance of the integrated chip 100. In some embodiments, during operation of the high voltage transistor 122, a high negative voltage (e.g., about −60V or more) may be applied to the drain region 132 and a high electric field would be present in the device substrate 108 at the drain region 132 and the second well region 118. The conductive gate electrode 134 and the contact region 136 are configured to attenuate the electric field and/or electrical potential at the drain region 132 and/or the second well region 118. For example, charge carriers may travel from the second well region 118 to the contact region 136 (e.g., traveling across the P-N junction diode structure of the conductive termination structure 121) and may accumulate in the conductive gate electrode 134. This, in part, may reduce the electric field strength along a surface of the device substrate 108, thereby increasing the breakdown voltage capability of the high voltage transistor 122.

Further, a first sidewall 134s1 of the conductive gate electrode 134 is laterally offset from an outer sidewall of the first isolation segment 110a by a first lateral distance L1. In various embodiments, the first lateral distance L1 is within a range of about 0 micrometers (um) to 0.2 um or another suitable value. In some embodiments, if the first lateral distance L1 is relatively small (e.g., less than about 0 um), then the conductive gate electrode 134 and the peripheral gate dielectric layer 133 may directly overlie at least a portion of the contact region 136 and/or the third well region 120. This, in part, may result in charge carriers tunneling through the peripheral gate dielectric layer 133 into the conductive gate electrode 134, thereby damaging the peripheral gate dielectric layer 133 and/or degrading a performance of the high voltage transistor 122. In further embodiments, if the first lateral distance L1 is relatively large (e.g., greater than about 0.2 um), then an overall size of the conductive gate electrode 134 is substantially reduced, thereby mitigating a capability of the conductive gate electrode 134 to reduce the electric field strength along the surface of the device substrate 108. This may reduce the breakdown capability of the high voltage transistor 122.

FIG. 1B illustrates a top view of some embodiments of the integrated chip 100 taken along line A-A' of FIG. 1A.

In some embodiments, as shown in the top view of FIG. 1B, the source region 126, the gate electrode 130, the second well region 118, the drain region 132, the conductive gate electrode 134, the third well region 120, the contact region 136, the first isolation structure 110, the second isolation structure 112, and the conductive via 114 are concentric ring-shaped regions/structures. It will be appreciated that although the aforementioned regions/structures are rectangular ring-shaped when viewed from above in FIG. 1B, the aforementioned regions/structures may also, for example, be square ring-shaped, triangular ring-shaped, circular ring-shaped, oval ring-shaped, or some other closed path shape. Thus, in some embodiments, the conductive gate electrode 134 continuously laterally surrounds the gate electrode 130. In yet further embodiments, the source region 126, the gate electrode 130, the second well region 118, the drain region 132, the conductive gate electrode 134, the third well region 120, the contact region 136, the first isolation structure 110, the second isolation structure 112, and the conductive via 114 are concentric with respect to one another and/or are each concentric with respect to a center of the body contact region 124. In various embodiments, the third well region 120 may be referred to as a peripheral termination well region and/or the contact region 136 may be referred to as a peripheral termination contact region.

In some embodiments, the first well region 116 may continuously extend from the center of the body contact region 124 to the first interface 113. Thus, when viewed from above, the dashed rectangle representing the first interface 113 may, for example, correspond to an outer perimeter of the first well region 116 and may correspond to an inner perimeter of the second well region 118. In yet further embodiments, the second well region 118 continuously extends from the first interface 113 to the second interface 115. Thus, when viewed from above, the dashed rectangle representing the second interface 115 may, for example correspond to an outer perimeter of the second well region 118 and may correspond to an inner perimeter of the third well region 120.

FIG. 1C illustrates some alternative embodiments of the top view of FIG. 1B, in which the conductive via 114 comprises a plurality of conductive pillars that collectively surround the gate electrode 130 and the conductive gate electrode 134. FIG. 1C illustrates some embodiments of a top view of the integrated chip 100 taken along line A-A' of FIG. 1A. In yet further embodiments, the second isolation structure 112 continuously surrounds each conductive pillar in the plurality of conductive pillars. Each conductive pillar in the plurality of conductive pillars may, for example, contact the handle substrate (104 of FIG. 1A) and/or be electrically coupled to ground (e.g., 0V), a ground node, a ground terminal, or the like.

Figure 2:
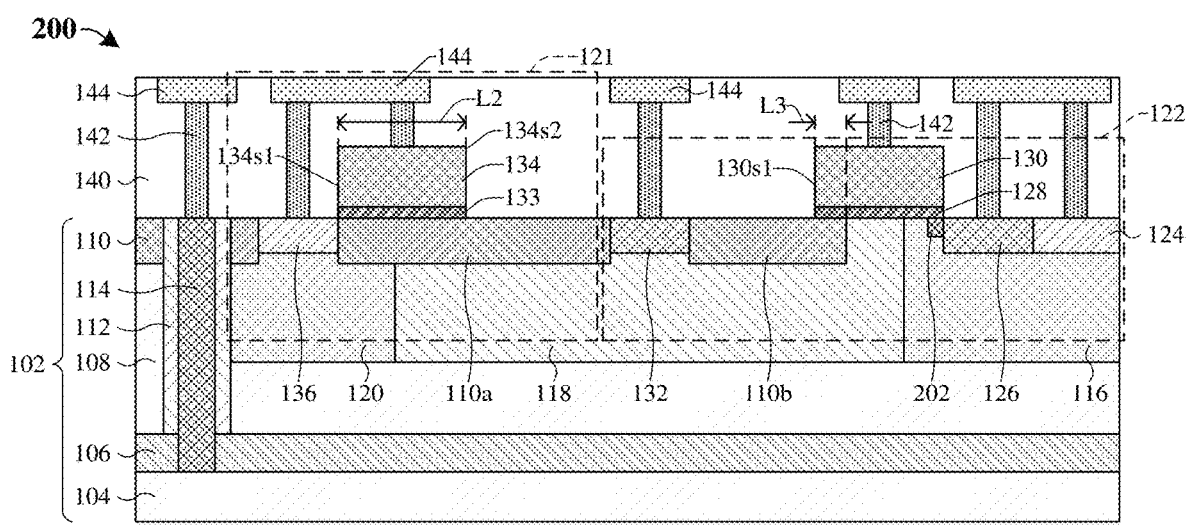
FIG. 2 illustrates a cross-sectional view of some alternative embodiments of an integrated chip comprising a conductive termination structure disposed laterally adjacent to a high voltage transistor.

FIG. 2 illustrates a cross-sectional view of some alternative embodiments of an integrated chip 200 comprising a conductive termination structure 121 disposed laterally adjacent to a high voltage transistor 122. The integrated chip 200 may comprise some aspects of the integrated chip 100 of FIGS. 1A-1C (and vice versa); and thus, the features and/or reference numerals explained above with regards to FIGS. 1A-1C are also applicable to the integrated chip 200 in FIG. 2.

The integrated chip 200 includes the high voltage transistor 122 disposed on a semiconductor substrate 102. The high voltage transistor 122 may be used in various applications, such as, for example, radio frequency (RF) components, high voltage applications such as gate drivers (insulated-gate bipolar transistor (IGBT)/Power metal-oxide-semiconductor field-effect transistor (MOSFET)), smart power/high voltage devices, pressure sensors, actuators, accelerometers, gyroscopes, or some other suitable application. In various embodiments, the semiconductor substrate 102 may be configured as an SOI substrate and comprises a handle substrate 104, a device substrate 108, and an insulator layer 106 disposed between the handle substrate 104 and the device substrate 108. In some embodiments, the insulator layer 106 may, for example, be or comprise silicon oxide, silicon-rich oxide (SRO), some other oxide, some other dielectric, or any combination of the foregoing. In some embodiments, the handle substrate 104 and the device substrate 108 may, for example, be or comprise a bulk substrate (e.g., a bulk silicon substrate), silicon, monocrystalline silicon, doped silicon, or another suitable semiconductor material. The handle substrate 104 may, for example, comprise a first doping type (e.g., p-type) with a doping concentration within a range of about $10^{14}$ to $10^{16}$ atoms/cm$^3$, or another suitable value. In various embodiments, the handle substrate 104 and the device substrate 108 may respectively have a resistance within a range of about 1 to 100 ohms-centimeter ($\Omega$*cm), or another suitable value. In some embodiments, if the resistance of the handle substrate 104 is relatively low (e.g., less than about 1$\Omega$*cm), then a breakdown voltage of the high voltage transistor 122 may be decreased. In yet further embodiments, if the resistance of the handle substrate 104 is relatively large (e.g., greater than about 100$\Omega$*cm), then a breakdown voltage of the high voltage transistor 122 may be increased.

A first isolation structure 110 is disposed within the device substrate 108 and extends continuously from a top surface of the device substrate 108 to a point below the top surface of the device substrate 108. The first isolation structure 110 may, for example, be configured as a shallow trench isolation (STI) structure or another suitable isolation structure. The first isolation structure 110 comprises a first isolation segment 110a and a second isolation segment 110b laterally separated from one another by a non-zero distance. Further, a second isolation structure 112 continuously extends from the top surface of the device substrate 108 to the insulator layer 106. The second isolation structure 112 may, for example, be configured as a deep trench isolation (DTI) structure or another suitable isolation structure. In some embodiments, the first and second isolation structures 110, 112 may, for example, respectively be or comprise silicon nitride, silicon carbide, silicon dioxide, silicon oxynitride, silicon oxycarbide, another suitable dielectric material, or any combination of the foregoing.

The high voltage transistor 122 comprises a source region 126, a drain region 132, a gate electrode 130, and a gate dielectric layer 128. The source region 126 and the drain region 132 are disposed within the device substrate 108 and are laterally separated from one another by the second isolation segment 110b of the first isolation structure 110. In various embodiments, the drain region 132 abuts the first and second isolation segments 110a, 110b of the first isolation structure 110. Further, the gate electrode 130 is disposed over the device substrate 108 and is spaced laterally between the source region 126 and the drain region 132. The gate dielectric layer 128 is disposed between the gate electrode 130 and the device substrate 108. In various embodiments, the high voltage transistor 122 is configured as a p-channel metal-oxide semiconductor (PMOS) transistor, a p-channel laterally diffused metal-oxide semiconductor (p-LDMOS) transistor, or another suitable device. In such embodiments, the source region 126 and the drain region 132 comprise the first doping type (e.g., p-type) and may have a doping concentration that is within a range of about $10^{14}$ to $10^{16}$ atoms/cm$^3$, or another suitable value. In further embodiments, the gate electrode 130 may, for example, be or comprise polysilicon and/or a metal gate material such as tungsten, titanium, tantalum, aluminum, another suitable conductive material, or any combination of the foregoing. In yet further embodiments, the gate dielectric layer 128 may, for example, be or comprise silicon dioxide, a high-κ dielectric material, or the like. As used herein, a high-κ dielectric material is a dielectric material with a dielectric constant greater than 3.9.

A lightly doped region 202 is disposed within the device substrate 108 and abuts a first side of the source region 126. A body contact region 124 is disposed within the device substrate 108 and abuts a second side of the source region 126, where the first side of the source region 126 is opposite the second side of the source region 126. In various embodiments, the lightly doped region 202 comprises the first doping type (e.g., p-type) having a doping concentration that is within a range of about $10^{12}$ to $10^{14}$ atoms/cm$^3$, or another suitable value. In further embodiments, the body contact region 124 comprises a second doping type (e.g., n-type) having a doping concentration that is within a range of about $10^{14}$ to $10^{16}$ atoms/cm$^3$, or another suitable value. In various embodiments, the first doping type is p-type and the second doping type is n-type, or vice versa.

A conductive via 114 extends continuously from the top surface of the semiconductor substrate 102 to a top surface of the handle substrate 104, such that the conductive via 114 is coupled to the handle substrate 104. In various embodiments, the second isolation structure 112 laterally encloses the conductive via 114 such that the second isolation structure 112 electrically isolates the conductive via 114 from devices disposed on/within the semiconductor substrate 102. In some embodiments, the conductive via 114 may be configured as or referred to as a through-substrate via (TSV). In yet further embodiments, the conductive via 114 may electrically couple the handle substrate 104 to a reference node, a reference terminal, a ground node, a ground terminal, or the like. In various embodiments, the reference terminal and/or the reference node may be biased with 0 V or another suitable value. In further embodiments, the conductive via 114 may, for example, be or comprise aluminum, copper, tungsten, another suitable conductive material, or any combination of the foregoing.

A first well region 116, a second well region 118, and a third well region 120 are disposed within the device substrate 108. The second well region 118 is disposed laterally between the first well region 116 and the third well region 120. In various embodiments, the second well region 118 comprises the first doping type (e.g., p-type), and the first and third well regions 116, 120 respectively comprise the second doping type (e.g., n-type). In various embodiments, the first, second, and third well regions 116, 118, and 120 respectively have doping concentration within a range of about $10^{11}$ to $10^{13}$ atoms/cm$^3$, or another suitable value. The drain region 132 is disposed within and abuts the second well region 118. In various embodiments, the second well region 118 is configured as a drift region (or, a "drain extension region") and has a relatively low doping concentration, which provides for a higher resistance at high operating voltages. Further, at least a portion of the gate electrode 130 of the high voltage transistor 122 directly overlies at least a portion of the second well region 118. Further, the lightly doped region 202, the source region 126, and the body contact region 124 are disposed within the first well region 116.

An interconnect structure overlies the device substrate 108 and comprises a dielectric structure 140, a plurality of conductive contacts 142, and a plurality of conductive wires 144. The conductive contacts and wires 142, 144 are disposed within the dielectric structure 140 and are configured to provide electrical connects to devices (e.g., the high voltage transistor 122) disposed on and/or within the semiconductor substrate 102. For example, the source region 126 and the body contact region 124 may be electrically coupled to one another by way of two or more conductive contacts 142 and at least one conductive wire 144. The dielectric structure 140 may include one or more dielectric layers. In various embodiments, the one or more dielectric layers may, for example, be or comprise an oxide, silicon dioxide, a low-κ dielectric material, silicon nitride, silicon carbide, another suitable dielectric material, or any combination of the foregoing. As used herein, a low-κ dielectric material is a dielectric material with a dielectric constant less than 3.9. In further embodiments, the conductive contacts and wires 142, 144 may, for example, be or comprise aluminum, copper, titanium, tantalum, titanium nitride, tantalum nitride, ruthenium, tungsten, another conductive material, or any combination of the foregoing.

The conductive termination structure 121 is disposed laterally adjacent to the drain region 132 of the high voltage transistor 122. In various embodiments, the conductive termination structure 121 includes the third well region 120, at least a portion of the second well region 118, a contact region 136 disposed within the third well region 120, and a termination gate structure including a conductive gate electrode 134 and a peripheral gate dielectric layer 133. The peripheral gate dielectric layer 133 is disposed between the conductive gate electrode 134 and the device substrate 108. In some embodiments, the conductive gate electrode 134 and the peripheral gate dielectric layer 133 directly overlie the first isolation segment 110a of the first isolation structure 110, such that an entire bottom surface of the peripheral gate dielectric layer 133 is in direct contact with a top surface of the first isolation segment 110a. In other words, in such embodiments, at least a portion of the top surface of the first isolation segment 110a directly contacts an entirety of the bottom surface of the peripheral gate dielectric layer 133. Further, the conductive gate electrode 134 is disposed laterally between the contact region 136 and the drain region 132. In further embodiments, the conductive gate electrode 134 directly overlies at least a portion of the third well region 120 and directly overlies at least a portion of the second well region 118. In yet further embodiments, the conductive gate electrode 134 is laterally offset from the contact region 136 by a non-zero distance in a direction towards the high voltage transistor 122.

In various embodiments, when the conductive termination structure 121 is laterally adjacent to the drain region 132 (and/or the drift region of the high voltage transistor 122), the third well region 120 and the contact region 136 respectively comprise the second doping type (e.g., n-type) which is opposite the first doping type (e.g., p-type) of the second well region 118 (i.e., the drift region). Thus, a P-N junction diode structure of the conductive termination structure 121 exists between the second well region 118 and the third well region 120. In various embodiments, the P-N junction diode structure of the conductive termination structure 121 facilitates the transfer of charge carriers from the second well region 118 to the contact region 136 and/or the conductive gate electrode 134 during operation of the integrated chip 200. This mitigates an electric field strength along a surface of the device substrate 108, thereby increasing the breakdown voltage capability of the high voltage transistor 122. In various embodiments, the contact region 136 is electrically coupled to the conductive gate electrode 134 by way of two or more conductive contacts 142 and at least one conductive wire 144. This facilitates the transfer of charge carriers from the contact region 136 to the conductive gate electrode 134, such that the conductive gate electrode 134 may store and/or accumulate charge carriers while the high voltage transistor 122 is operating at high voltages. Thus, damage to the semiconductor substrate 102 and/or the high voltage transistor 122 may be mitigated at high operating voltages, thereby increasing the breakdown voltage capability of the high voltage transistor 122.

The conductive gate electrode 134 may, for example, be or comprise polysilicon and/or a metal gate material such as tungsten, titanium, tantalum, aluminum, another suitable conductive material, or any combination of the foregoing. The peripheral gate dielectric layer 133 may, for example, be or comprise silicon dioxide, a high-K dielectric material, or the like. In further embodiments, the conductive gate electrode 134 comprises a same conductive material (e.g., polysilicon) as the gate electrode 130. In yet further embodiments, the peripheral gate dielectric layer 133 comprises a same dielectric material (e.g., a high-K dielectric material) as the gate dielectric layer 128. In various embodiments, the contact region 136 has a doping concentration within a range of about $10^{14}$ to $10^{16}$ atoms/cm$^3$, or another suitable value.

The conductive gate electrode 134 comprises a first sidewall 134s1 and a second sidewall 134s2 opposite the first sidewall 134s1. In various embodiments, outer opposing sidewalls of the peripheral gate dielectric layer 133 are aligned with the first and second sidewalls 134s1, 134s2 of the conductive gate electrode 134. In some embodiments, the first sidewall 134s1 is aligned with an outer sidewall of the first isolation segment 110a (e.g., the first lateral distance (L1 of FIG. 1A) is zero). The second sidewall 134s2 of the conductive gate electrode 134 is laterally offset from the outer sidewall of the first isolation segment 110a by a second lateral distance L2. In some embodiments, the second lateral distance L2 is within a range of about 0.3 um to 7 um or another suitable value. In an embodiment, if the second lateral distance L2 is relatively small (e.g., less than about 0.3 um), then an overall size of the conductive gate electrode 134 is reduced, thereby mitigating a capability of the conductive gate electrode 134 to reduce the electric field strength along the surface of the device substrate 108. This may reduce the breakdown capability of the high voltage transistor 122. In another embodiment, if the second lateral distance L2 is relatively large (e.g., greater than about 7 um), then the conductive gate electrode 134 may be relatively close to the drain region 132 and/or may overlie at least a portion of the drain region 132. This may result in charge carriers tunneling from the drain region 132 through the peripheral gate dielectric layer 133 into the conductive gate electrode 134, thereby damaging the peripheral gate dielectric layer 133 and/or degrading a performance of the high voltage transistor 122. In yet further embodiments, the second lateral distance L2 may correspond to a width of the conductive gate electrode 134.

In addition, a sidewall 130s1 of the gate electrode 130 is laterally offset from an outer sidewall of the second isolation segment 110b by a third lateral distance L3. In some embodiments, the third lateral distance L3 is within a range of about 0.3 um to 7 um or another suitable value. In an embodiment, if the third lateral distance L3 is relatively small (e.g., less than about 0.3 um), then an overall size of the gate electrode 130 may be substantially small, thereby mitigating a performance of the high voltage transistor 122. In yet another embodiment, if the third lateral distance L3 is relatively large (e.g., greater than about 7 um), then the gate electrode 130 may be relatively close to the drain region 132. This may adversely affect the flow of charge carriers from the source region 126 to the drain region 132, thereby mitigating the performance of the high voltage transistor 122 (e.g., reducing the breakdown voltage capability of the high voltage transistor 122).

Figure 3A:
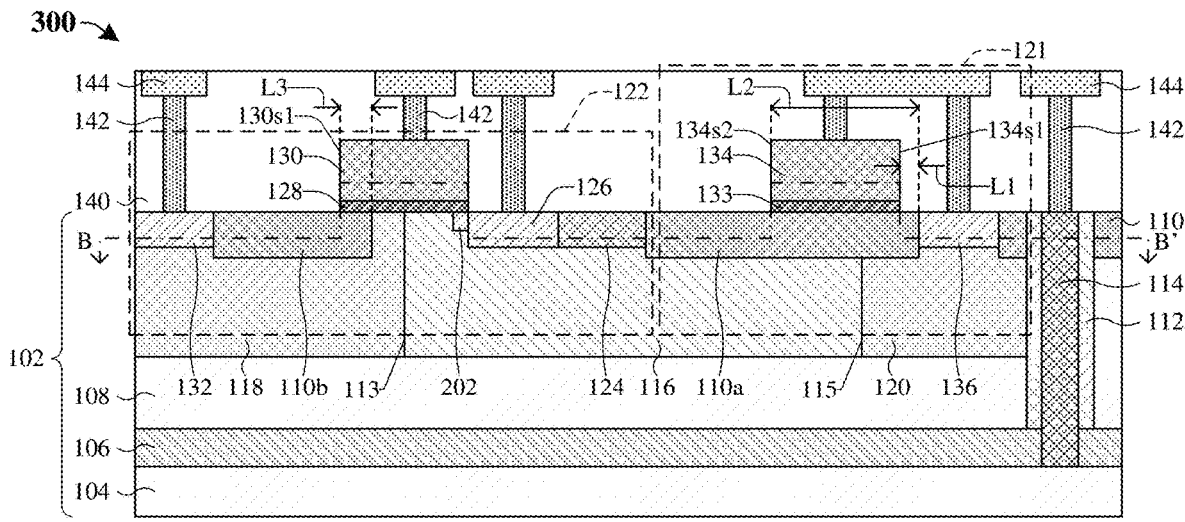
FIG. 3A illustrates a cross-sectional view of some different embodiments of an integrated chip comprising a conductive termination structure disposed laterally adjacent to a high voltage transistor.

FIG. 3A illustrates a cross-sectional view of some embodiments of an integrated chip 300 comprising a conductive termination structure 121 disposed laterally adjacent to a high voltage transistor 122. The integrated chip 300 of FIG. 3A may correspond to some embodiments of the integrated chip 100 of FIGS. 1A-1C, in which the high voltage transistor 122 is configured as an NMOS transistor.

In various embodiments, the conductive termination structure 121 is disposed laterally between the conductive via 114 and the source region 126 of the high voltage transistor 122. The handle substrate 104 comprises a first doping type (e.g., p-type). As illustrated in FIG. 3A, the high voltage transistor 122 is configured as an NMOS transistor, an n-channel LDMOS (n-LDMOS) transistor, or another suitable device. In such embodiments, the body contact region 124 comprises the first doping type (e.g., p-type, and the drain region 132, the source region 126, and the lightly doped region 202 respectively comprise a second doping type (e.g., n-type) opposite the first doping type. In various embodiments, the first doping type is p-type and the second doping type is n-type. Further, the first well region 116 is disposed laterally between the second well region 118 and the third well region 120. In some embodiments, the first well region 116 comprises the first doping type (e.g., p-type), and the second and third well regions 118, 120 respectively comprise the second doping type (e.g., n-type). In various embodiments, the second well region 118 is configured as a drift region (or a "drain extension region") such that the third well region 120 of the conductive termination structure 121 is laterally separated from the drift region by the first well region 116.

In various embodiments, when the conductive termination structure 121 is laterally adjacent to the source region 126 and/or the body contact region 124, the third well region 120 and the contact region 136 respectively comprise the second doping type (e.g., n-type) which is opposite the first doping type (e.g., p-type) of the first well region 116. Thus, a P-N junction diode structure of the conductive termination structure 121 exists between the first well region 116 and the third well region 120. In various embodiments, the P-N junction diode structure of the conductive termination structure 121 facilitates the transfer of charge carriers from the first well region 116 to the contact region 136 and/or the conductive gate electrode 134 during operation of the integrated chip 300. This mitigates an electric field strength along a surface of the device substrate 108, thereby increasing the breakdown voltage capability of the high voltage transistor 122. In yet further embodiments, the second well region 118 (i.e., the drift region) and the third well region 120 of the conductive termination structure 121 comprise a same doping type (e.g., n-type).

In various embodiments, the drain region 132, the source region 126, and the contact region 136 comprise the second doping type (e.g., n-type) and may have a doping concentration that is within a range of about $10^{14}$ to $10^{16}$ atoms/$cm^3$, or another suitable value. In further embodiments, the second and third well regions 118, 120 comprise the second doping type (e.g., n-type) and may have a doping concentration that is within a range of about $10^{11}$ to $10^{13}$ atoms/$cm^3$, or another suitable value. In some embodiments, the first well region 116 comprises the first doping type (e.g., p-type) and may have a doping concentration that is within a range of about $10^{11}$ to $10^{13}$ atoms/$cm^3$, or another suitable value.

Figure 3B:
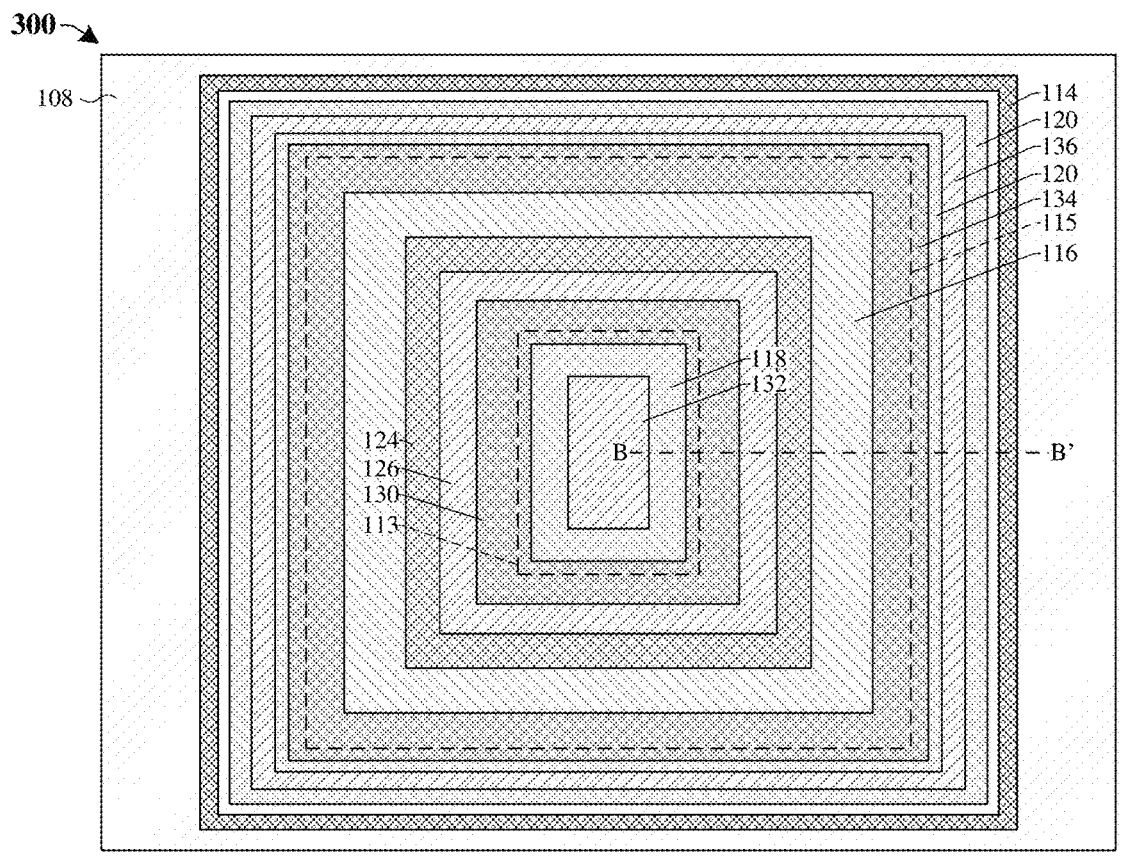
FIG. 3B illustrates a top view of some embodiments of the integrated chip of FIG. 3A.

FIG. 3B illustrates a top view of some embodiments of the integrated chip 300 taken along line B-B' of FIG. 3A. For clarity and ease of illustration, the first isolation structure 110 and the second isolation structure 112 are omitted from the top view of FIG. 3B.

In some embodiments, as shown in the top view of FIG. 3B, the gate electrode 130, the source region 126, the body contact region 124, the first well region 116, the conductive gate electrode 134, the third well region 120, the contact region 136, and the conductive via 114 are concentric ring-shaped regions/structures. It will be appreciated that although the aforementioned regions/structures are rectangular ring-shaped when viewed from above in FIG. 3B, the aforementioned regions/structures may also, for example, be square ring-shaped, triangular ring-shaped, circular ring-shaped, oval ring-shaped, or some other closed path shape. In further embodiments, the gate electrode 130, the source region 126, the body contact region 124, the first well region 116, the conductive gate electrode 134, the third well region 120, the contact region 136, and the conductive via 114 are concentric with respect to one another and/or are each concentric with respect to a center of the drain region 132.

Figure 3C:
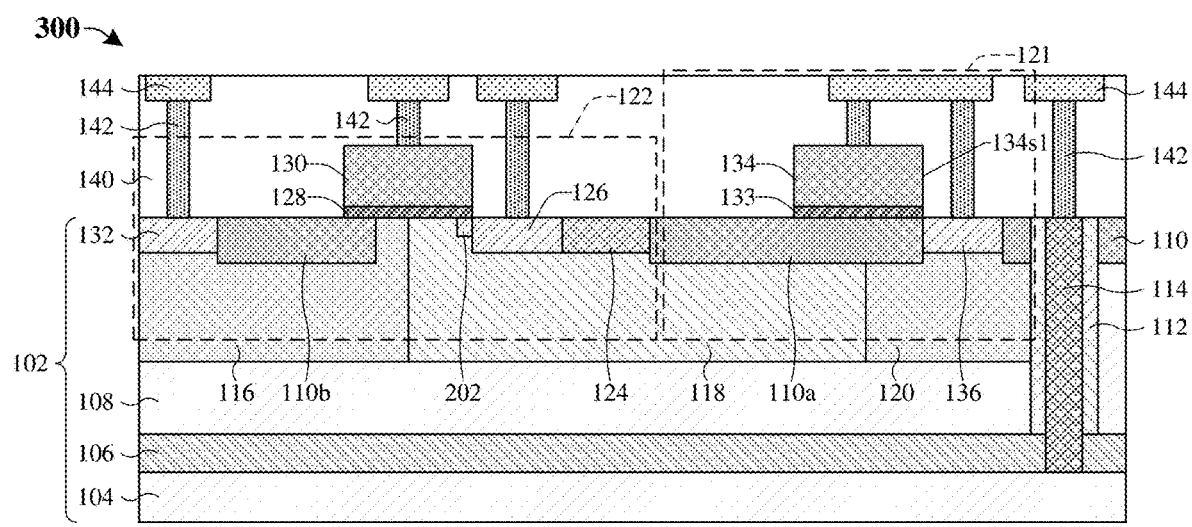
FIG. 3C illustrates a cross-sectional view of some alternative embodiments of an integrated chip comprising a conductive termination structure disposed laterally adjacent to a high voltage transistor.

FIG. 3C illustrates a cross-sectional view of some alternative embodiments of the integrated chip 300 of FIGS. 3A and 3B, in which a first sidewall 134s1 of the conductive gate electrode 134 is aligned with an outer sidewall of the first isolation segment 110a of the first isolation structure 110.

Figure 4A:
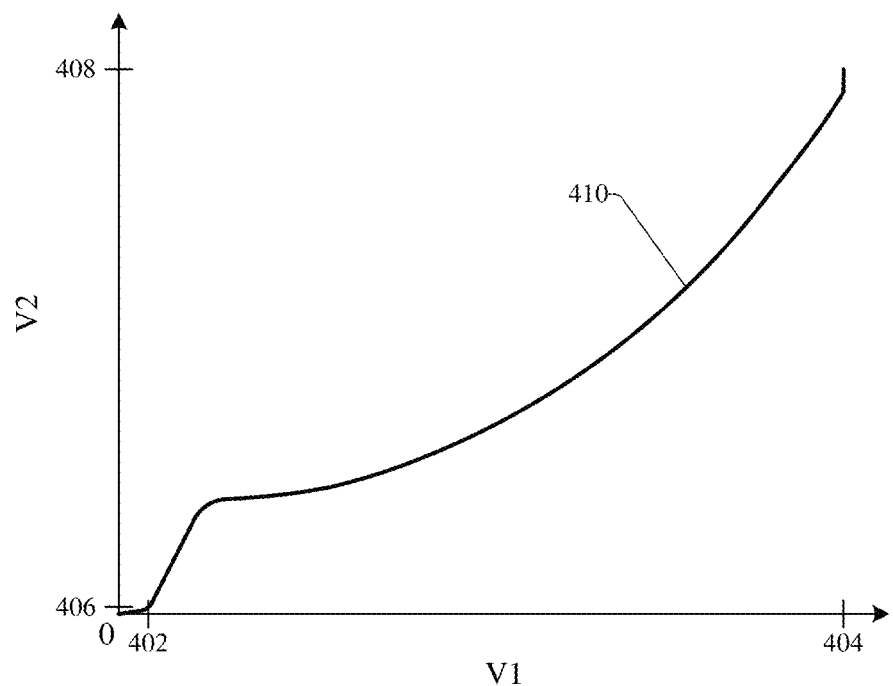
FIGS. 4A-4B illustrate various embodiments of graphs corresponding to operation of an integrated chip comprising a conductive termination structure disposed laterally adjacent to a high voltage transistor.

FIG. 4A illustrates a graph 400a of some embodiments of operating the integrated chip of FIGS. 1A-1C, 2, or 3A-3B. The graph 400a provides one example of operating conditions applied to the integrated chip. However, it should be appreciated that other operating conditions are amenable, whereby the graph 400a is merely an example. The x-axis of the graph 400a corresponds to a first voltage V1 and the y-axis of the graph 400a corresponds to a second voltage V2.

As illustrated in FIG. 4A, in various embodiments, the first voltage V1 may correspond to a bias voltage applied to the source region (126 of FIG. 1A) and to the gate electrode (130 of FIG. 1A), and the second voltage V2 may correspond to a voltage at the conductive gate electrode (134 of FIG. 1A) and/or the contact region (136 of FIG. 1A). A voltage curve 410 reflects operating characteristic of the high voltage transistor (122 of FIG. 1A) and the conductive termination structure (121 of FIG. 1A). In such embodiments, during operation of the integrated chip (100 of FIG. 1A), the first voltage V1 is applied to both the source region (126 of FIG. 1A) and the gate electrode (130 of FIG. 1A), the handle substrate (104 of FIG. 1A) is electrically coupled to ground (e.g., 0V) by way of the conductive via (114 of FIG. 1A), and the drain region (132 of FIG. 1A) is electrically coupled to ground (e.g., 0V). In yet further embodiments, under such operating conditions, a value of the second voltage V2 at the conductive gate electrode (134 of FIG. 1A) may be represented by the equation: $V2=X*V1$, where X is a positive number within a range of about 0.01 to 0.02, about 0.014, or another suitable value. Thus, as illustrated by the voltage curve 410, as a magnitude of the first voltage V1 increases, a magnitude of the second voltage V2 at the conductive gate electrode (134 of FIG. 1A) increases. This, in part, is because charge carriers may traverse the P-N junction diode structure of the conductive termination structure (121 of FIG. 1A) to the conductive gate electrode (134 of FIG. 1A). Thus, the conductive termination structure (121 of FIG. 1A) facilitates a reduction of the electric field strength along a surface of the device substrate (108 of FIG. 1A) as the first voltage V1 applied to the source region (126 of FIG. 1A) and/or the gate electrode (130 of FIG. 1A) increases.

In various embodiments, the first voltage V1 may increase from a first voltage value 402 to a second voltage value 404, where the first voltage value 402 is about +5V, +10V, or another suitable value and the second voltage value 404 is about +100V, +105V, +110V, or another suitable value. In yet further embodiments, the second voltage V2 may increase from a third voltage value 406 to a fourth voltage value 408, where the third voltage value 406 is about +0.05V, +0.07V, or another suitable value and the fourth voltage value 408 is about +1.55V, +1.5V, or another suitable value.

Figure 4B:
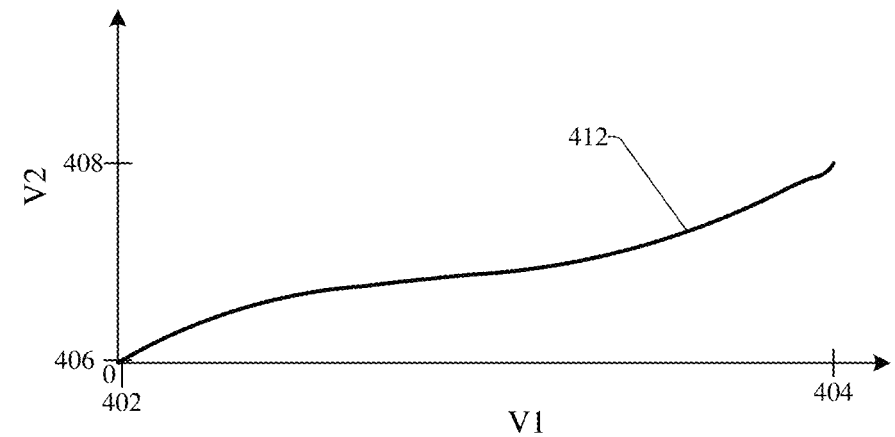

FIG. 4B illustrates a graph 400b of some embodiments of operating the integrated chip of FIGS. 1A-1C, 2, or 3A-3B. The graph 400b provides one example of operating conditions applied to the integrated chip. However, it should be appreciated that other operating conditions are amenable, whereby the graph 400b is merely an example. The x-axis of the graph 400a corresponds to a first voltage V1 and the y-axis of the graph 400a corresponds to a second voltage V2.

As illustrated in FIG. 4B, in some embodiments, the first voltage V1 may correspond to a bias voltage applied to the drain region (132 of FIG. 1A), and the second voltage V2 may correspond to a voltage at the conductive gate electrode (134 of FIG. 1A) and/or the contact region (136 of FIG. 1A). A voltage curve 412 reflects operating characteristics of the high voltage transistor (122 of FIG. 1A) and the conductive termination structure (121 of FIG. 1A). In such embodiments, during operation of the integrated chip (100 of FIG. 1A), the first voltage V1 is applied to the drain region (132 of FIG. 1A), and the handle substrate (104 of FIG. 1A), the source region (126 of FIG. 1A), and the gate electrode (130 of FIG. 1A) are each electrically coupled to ground (e.g., 0V). Under such operating conditions, a value of the second voltage V2 at the conductive gate electrode (134 of FIG. 1A) may, for example, be represented by the equation: $V2=Y*V1$, where Y is a positive number within a range of about 0.20 to 0.40, about 0.314, or another suitable value.

In various embodiments, the first voltage V1 may increase from a first voltage value 402 to a second voltage value 404, where the first voltage value 402 is about −0.01V, −0.05V, or another suitable value and the second voltage value 404 is about −100V, −105V, −110V, or another suitable value. In yet further embodiments, the second voltage V2 may increase from a third voltage value 406 to a fourth voltage value 408, where the third voltage value 406 is about −0.05V, −0.05V, or another suitable value and the fourth voltage value 408 is about −30V, −35V, or another suitable value.

FIGS. 5A-5B through 11A-11B illustrate various views of some embodiments of a method for forming an integrated chip comprising a conductive termination structure disposed laterally adjacent to a high voltage transistor according to the present disclosure. Figures with a suffix of "A" illustrate a cross-sectional view of the integrated chip during various formation processes. Figures with a suffix of "B" illustrate a top view taken along the line A-A' of FIGS. With a suffix of "A". Although the various views shown in FIGS. 5A-5B through 11A-11B are described with reference to a method, it will be appreciated that the structures shown in FIGS. 5A-5B through 11A-11B are not limited to the method but rather may stand alone separate of the method. Although FIGS. 5A-5B through 11A-11B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5A:
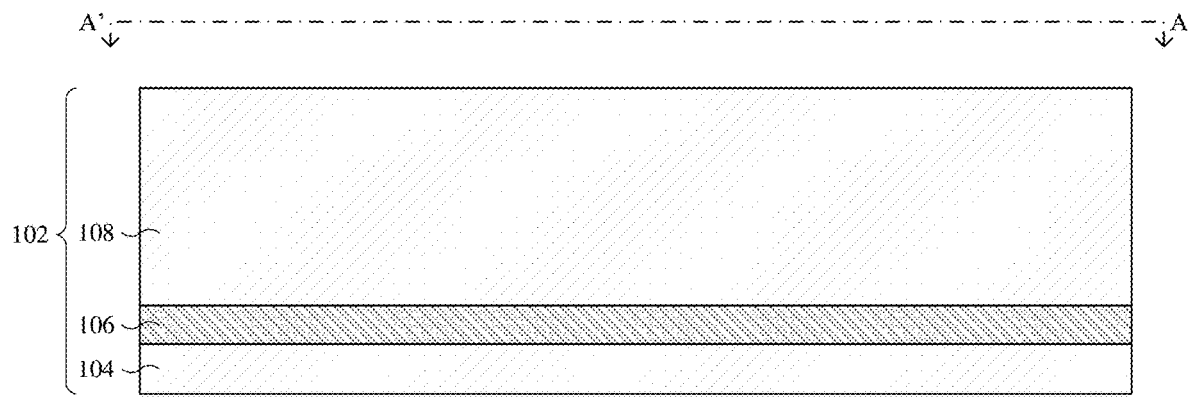
FIGS. 5A-5B through 11A-11B illustrate various views of some embodiments of a method for forming an integrated chip comprising a conductive termination structure disposed laterally adjacent to a high voltage transistor.
Figure 5B:
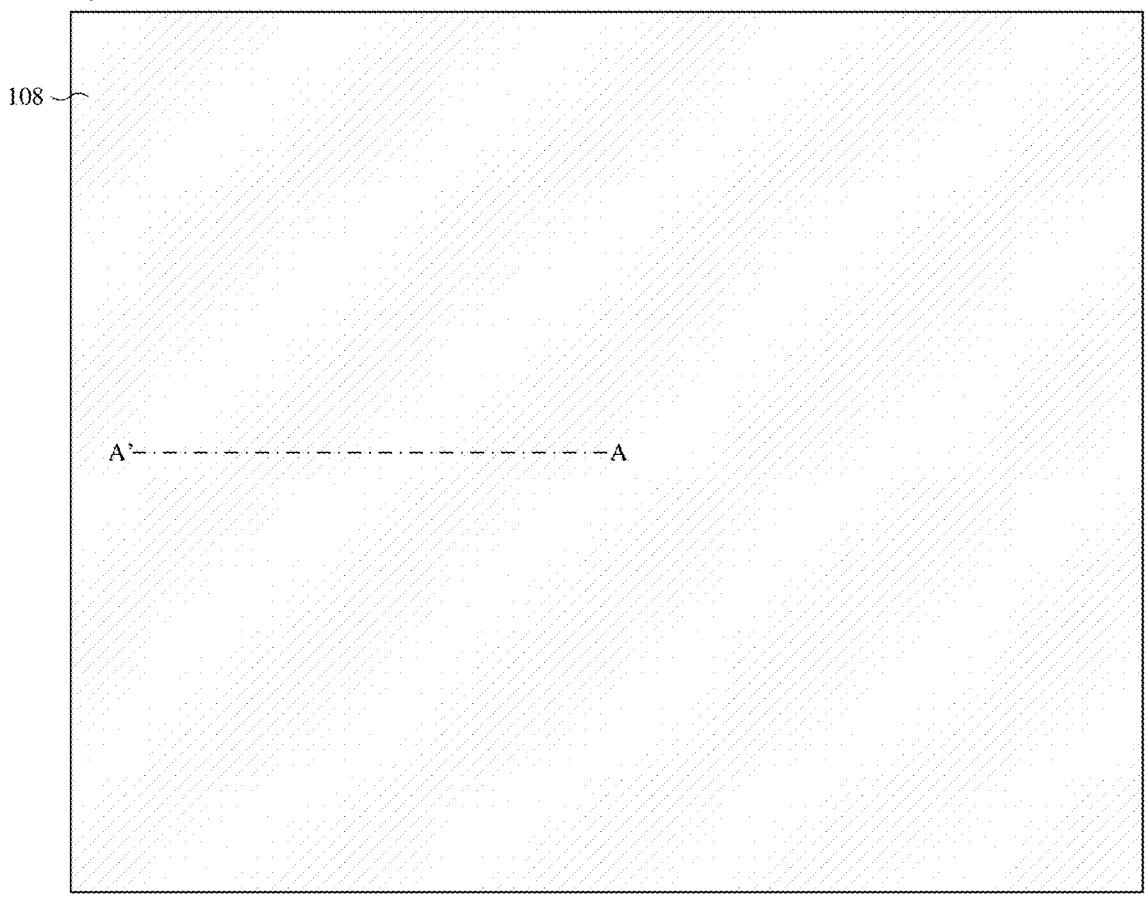

As shown in cross-sectional view 500a and top view 500b of FIGS. 5A-5B, a semiconductor substrate 102 is provided. In some embodiments, the semiconductor substrate 102 is configured as an SOI substrate and comprises a handle substrate 104, a device substrate 108, and an insulator layer 106 disposed between the handle substrate 104 and the device substrate 108. A process for forming the semiconductor substrate 102 may include: depositing (e.g., by thermal oxidation, physical vapor deposition (PVD), chemical vapor deposition (CVD), atomic layer deposition (ALD), etc.) the insulator layer 106 over the handle substrate 104; and bonding the device substrate 108 to the insulator layer 106. The handle substrate 104 may comprise a first doping type (e.g., p-type). In various embodiments, the handle substrate 104 and the device substrate 108 may respectively have a resistance within a range of about 1 to 100 ohms-centimeter ($\Omega$*cm), or another suitable value. In yet further embodiments, a thickness of the device substrate 108 is greater than a thickness of the handle substrate 104.

Figure 6A:
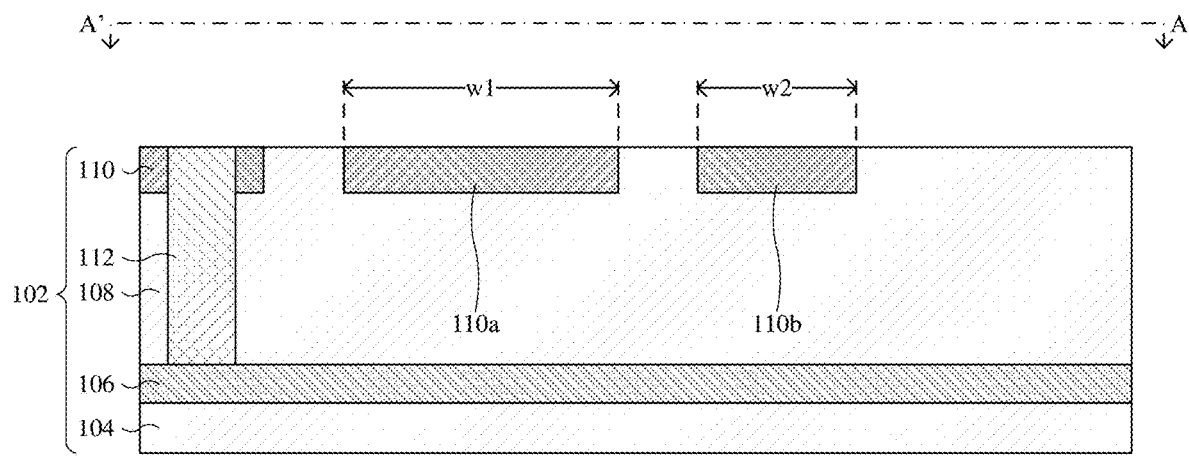
Figure 6B:
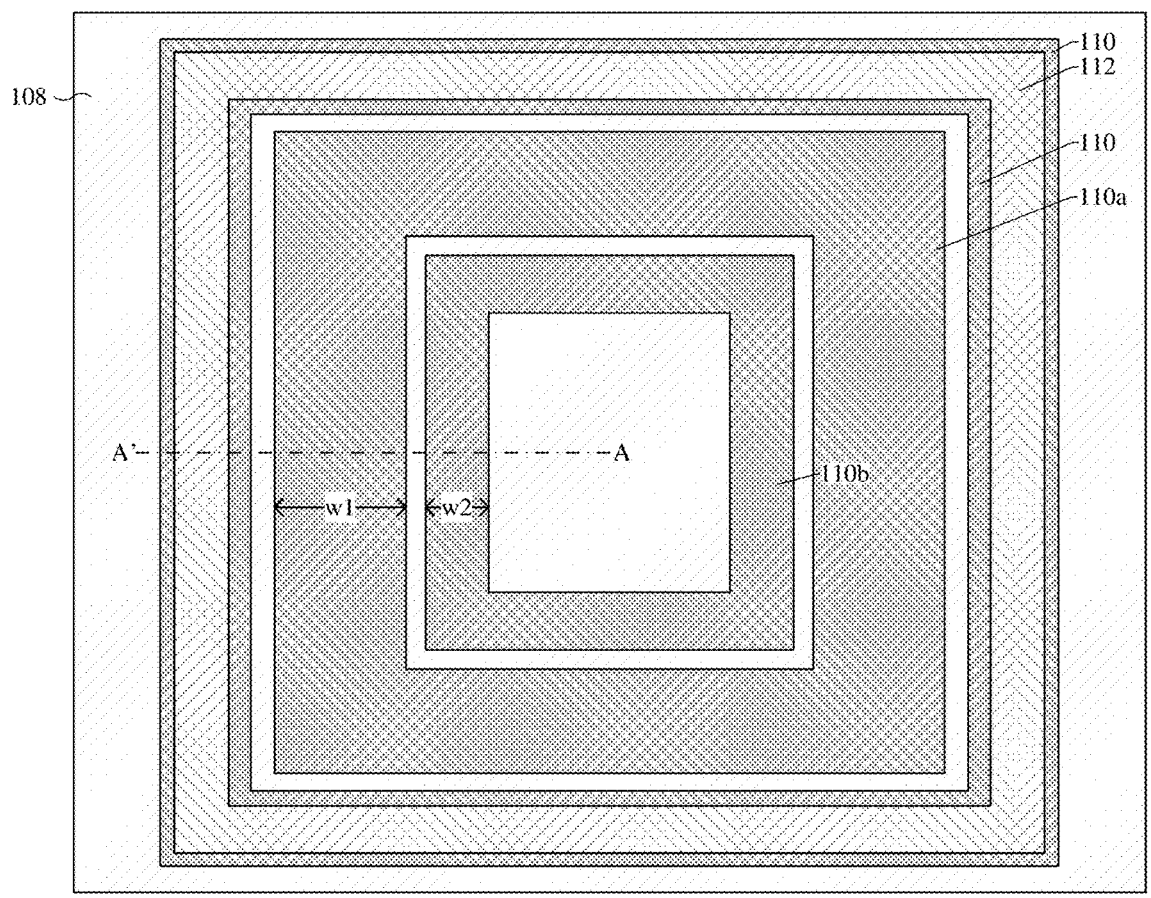

As shown in cross-sectional view 600a and top view 600b of FIGS. 6A-6B, a first isolation structure 110 and a second isolation structure 112 are formed within the device substrate 108. In some embodiments, a process for forming the first isolation structure 110 may include: forming a masking layer (not shown) over a top surface of the device substrate 108; selectively etching the device substrate 108 according to the masking layer to form openings the extend into the top surface of the device substrate 108; filling (e.g., by CVD, PVD, ALD, thermal oxidation, etc.) the openings with a dielectric material; and performing a removal process to remove the masking layer. In some embodiments, after filling the openings with the dielectric material, a planarization process (e.g., a chemical mechanical planarization (CMP) process) may be performed on the dielectric material. In various embodiments, the second isolation structure 112 may be formed by process(es) substantially similar to the process(es) described above regarding the formation of the first isolation structure. In yet further embodiments, the first isolation structure 110 is formed such that the first isolation structure 110 comprises a first isolation segment 110a laterally offset from a second isolation segment 110b by a non-zero distance. In further embodiments, a first width w1 of the first isolation segment 110a is greater than a second width w2 of the second isolation segment 110b. In yet further embodiments, the first width w1 and the second width w2 are each within a range of about 1 um to 10 um, or another suitable value. In some embodiments, as seen in FIG. 6B, the first and second isolation structures 110, 112 are formed such that the first and second isolation structures 110, 112 are and/or comprise one or more ring-shaped structures.

Figure 7A:
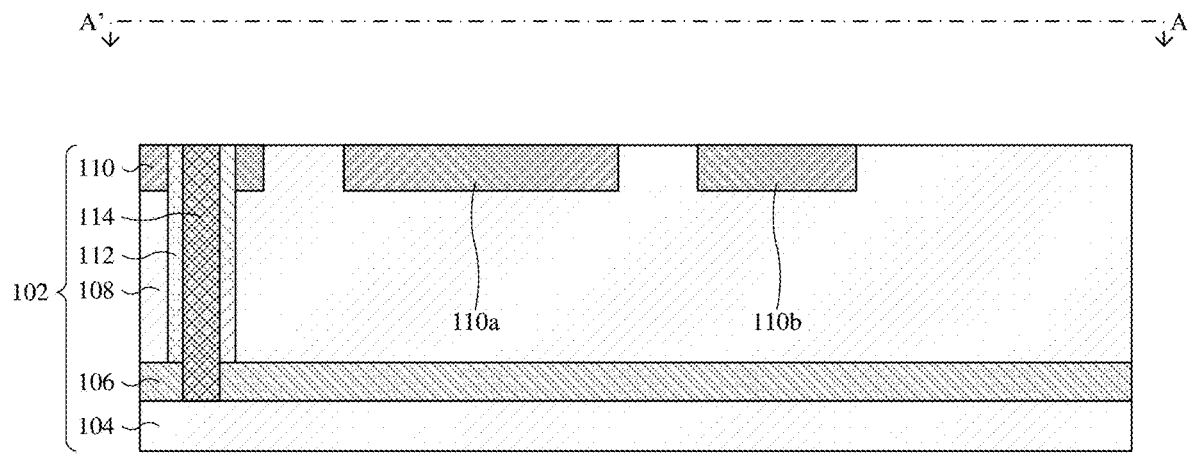
Figure 7B:
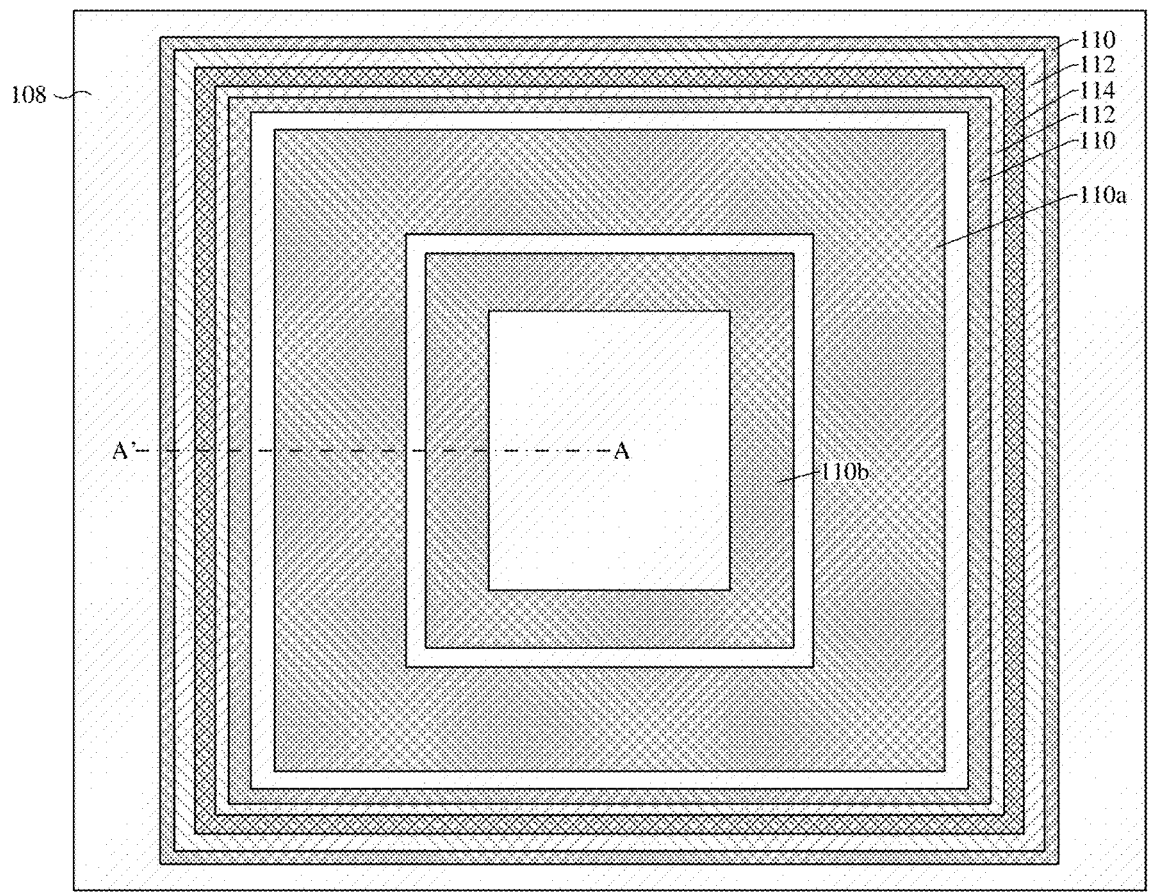

As shown in cross-sectional view 700a and top view 700b of FIGS. 7A-7B, a conductive via 114 is formed within the device substrate 108. In some embodiments, a process for forming the conductive via 114 comprises: selectively etching the second isolation structure 112 and the insulator layer 106 to form a trench extending from the top surface of the device substrate 108 to the handle substrate 104; depositing (e.g., by CVD, PVD, sputtering, electroplating, electroless plating, etc.) a conductive material (e.g., titanium, copper, aluminum, tungsten, tantalum, etc.) within the trench; and performing a planarization process (e.g., a CMP process) into the conductive material. In various embodiments, the planarization process is performed such that a top surface of the conductive via 114 is co-planar with a top surface of the first isolation structure 110, the second isolation structure 112, and/or the top surface of the device substrate 108. In further embodiments, the second isolation structure 112 laterally encloses the conductive via 114 such that the second isolation structure 112 separates the conductive via 114 from the device substrate 108. In some embodiments, as seen in FIG. 7B, the conductive via 114 is formed such that the conductive via 114 is a ring-shaped structure.

Figure 8A:
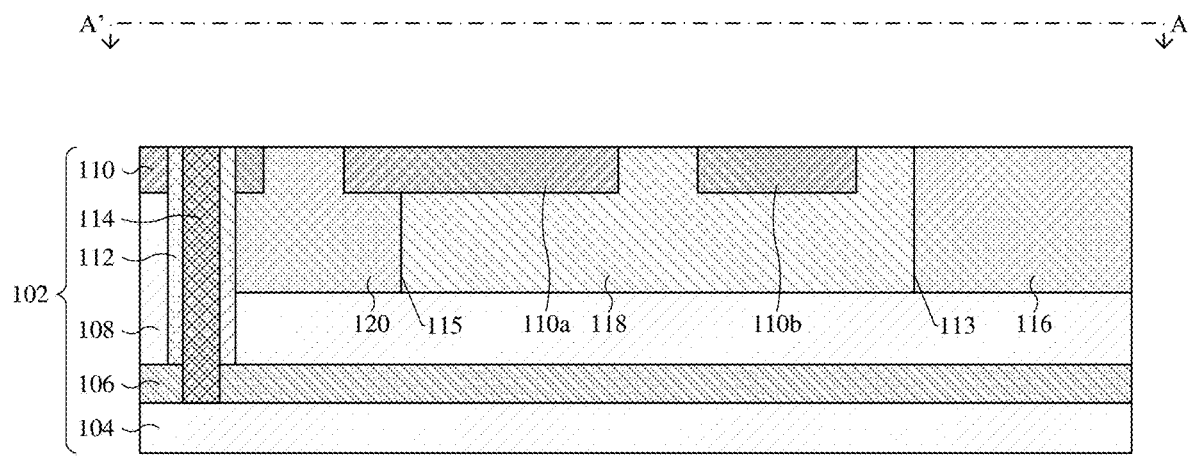
Figure 8B:
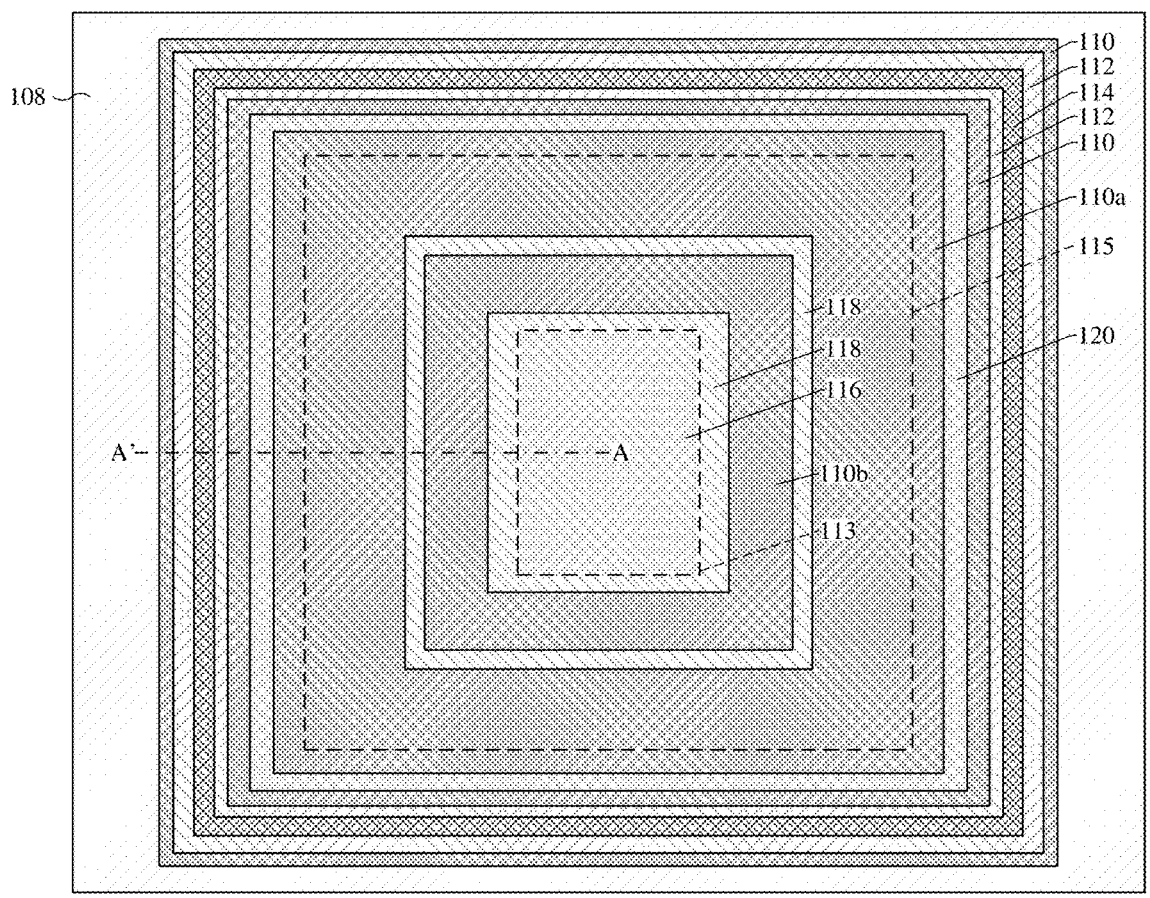

As shown in cross-sectional view 800a and top view 800b of FIGS. 8A-8B, one or more ion implantation processes are performed on the device substrate 108 to form one or more doped regions within the device substrate 108. In various embodiments, the one or more ion implantation process may be performed to form a first well region 116, a second well region 118, and a third well region 120. In some embodiments, the second well region 118 comprises the first doping type (e.g., p-type), and the first and third well regions 116, 120 respectively comprise a second doping type (e.g., n-type) opposite the first doping type (e.g., p-type). In further embodiments, the one or more ion implantation processes may each include: forming a masking layer (not shown) over the top surface of the device substrate 108; selectively implanting dopants according to the masking layer into the device substrate 108; and performing a removal process to remove the masking layer. In yet further embodiments, a first ion implantation process may be performed to form the first and third well regions 116, 120, and a separate second ion implantation process may be performed to form the second well region 118. P-type dopants of the first doping type may, for example, be or comprise boron, difluoroboron (e.g., $BF_2$), indium, some other suitable p-type dopants, or any combination of the foregoing. Further, n-type dopants of the second doping type may, for example, be or comprise phosphorous, arsenic, antimony, some other suitable n-type dopants, or any combination of the foregoing. In various embodiments, the second well region 118 may be configured as a drift region. In some embodiments, as seen in FIG. 8B, the second and third well regions 118, 120 are formed such that the second and third well regions 118, 120 are ring-shaped regions.

Figure 9A:
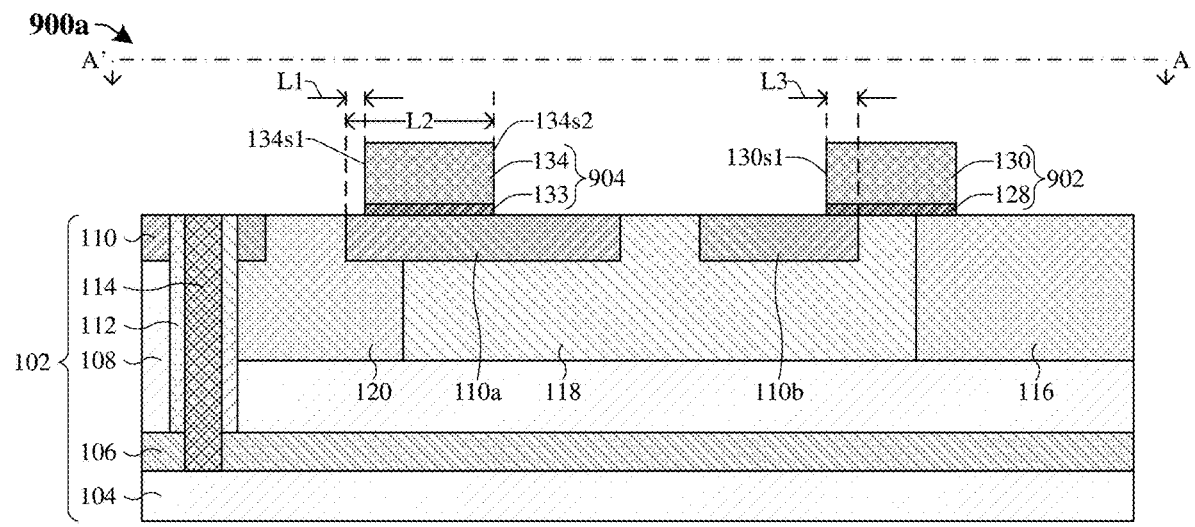
Figure 9B:
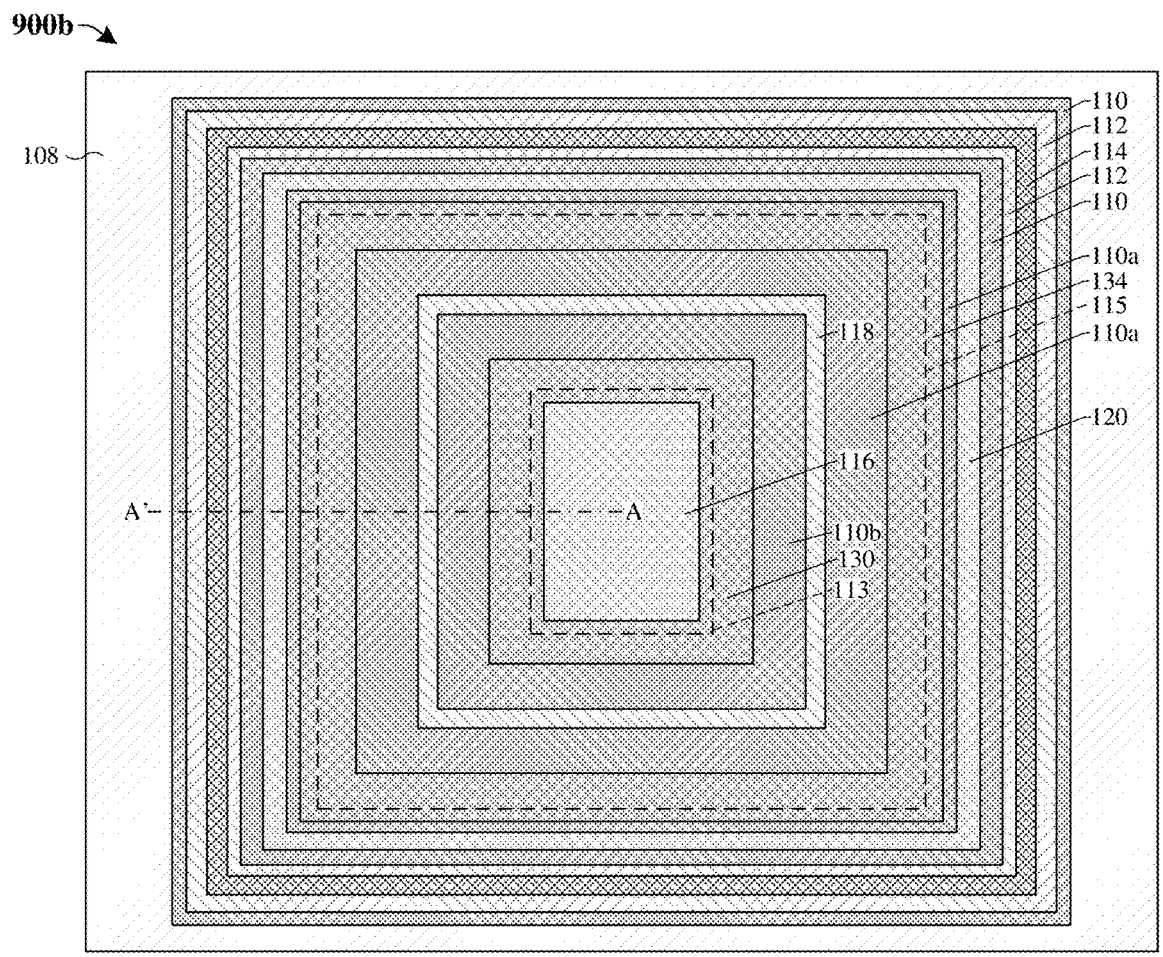

As shown in cross-sectional view 900a and top view 900b of FIGS. 9A-9B, a gate structure 902 and a termination gate structure 904 are formed over the top surface of the device substrate 108. The gate structure 902 includes a gate dielectric layer 128 and a gate electrode 130 overlying the gate dielectric layer 128, and the termination gate structure 904 includes a peripheral gate dielectric layer 133 and a conductive gate electrode 134 overlying the peripheral gate dielectric layer 133. In some embodiments, a process for forming the gate structure 902 and the termination gate structure 904 includes: depositing (e.g., by CVD, PVD, ALD, thermal oxidation, etc.) a gate dielectric structure over the top surface of the device substrate 108; depositing (e.g., by CVD, PVD, sputtering, electroplating, electroless plating, etc.) a gate electrode layer over the gate dielectric material; and patterning the gate dielectric structure and the gate electrode layer by a masking layer (not shown) to define the gate electrode 130, the gate dielectric layer 128, the conductive gate electrode 134, and the peripheral gate dielectric layer 133. Thus, in some embodiments, the gate structure 902 may be formed concurrently with the termination gate structure 904. The gate dielectric structure may, for example, be or comprise silicon dioxide, a high-κ dielectric material, or the like. The gate electrode layer may, for example, be or comprise polysilicon and/or a metal gate material such as tungsten, titanium, tantalum, aluminum, another suitable conductive material, or any combination of the foregoing. In some embodiments, as seen in FIG. 9B, the gate structure 902 and the termination gate structure 904 are formed such that the gate structure 902 and the termination gate structure 904 are ring-shaped structures.

In further embodiments, the termination gate structure 904 is formed such that a first sidewall 134s1 of the conductive gate electrode 134 is laterally offset from an outer sidewall of the first isolation segment 110a by a first lateral distance L1, and a second sidewall 134s2 of the conductive gate electrode 134 is laterally offset from the outer sidewall of the first isolation segment 110a by a second lateral distance L2. In some embodiments, the first lateral distance L1 is within a range of about 0 um to 0.2 um or another suitable value, and the second lateral distance L2 is within a range of about 0.3 um to 7 um or another suitable value. In various embodiments, the first lateral distance L1 is equal to zero, such that the outer sidewall of the first isolation segment 110a is aligned with the first sidewall 134s1 of the conductive gate electrode 134 (e.g., as illustrated and/or described in FIG. 2). In yet further embodiments, the gate structure 902 is formed such that a sidewall 130s1 of the gate electrode 130 is laterally offset from an outer sidewall of the second isolation segment 110b by a third lateral distance L3. In some embodiments, the third lateral distance L3 is within a range of about 0.3 um to 7 um, or another suitable value.

Figure 10A:
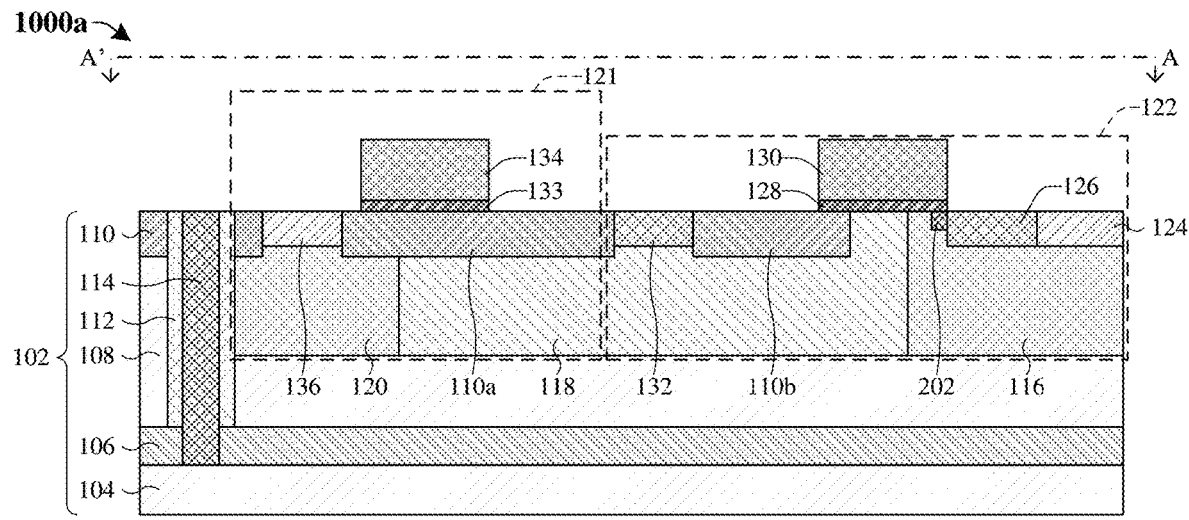
Figure 10B:
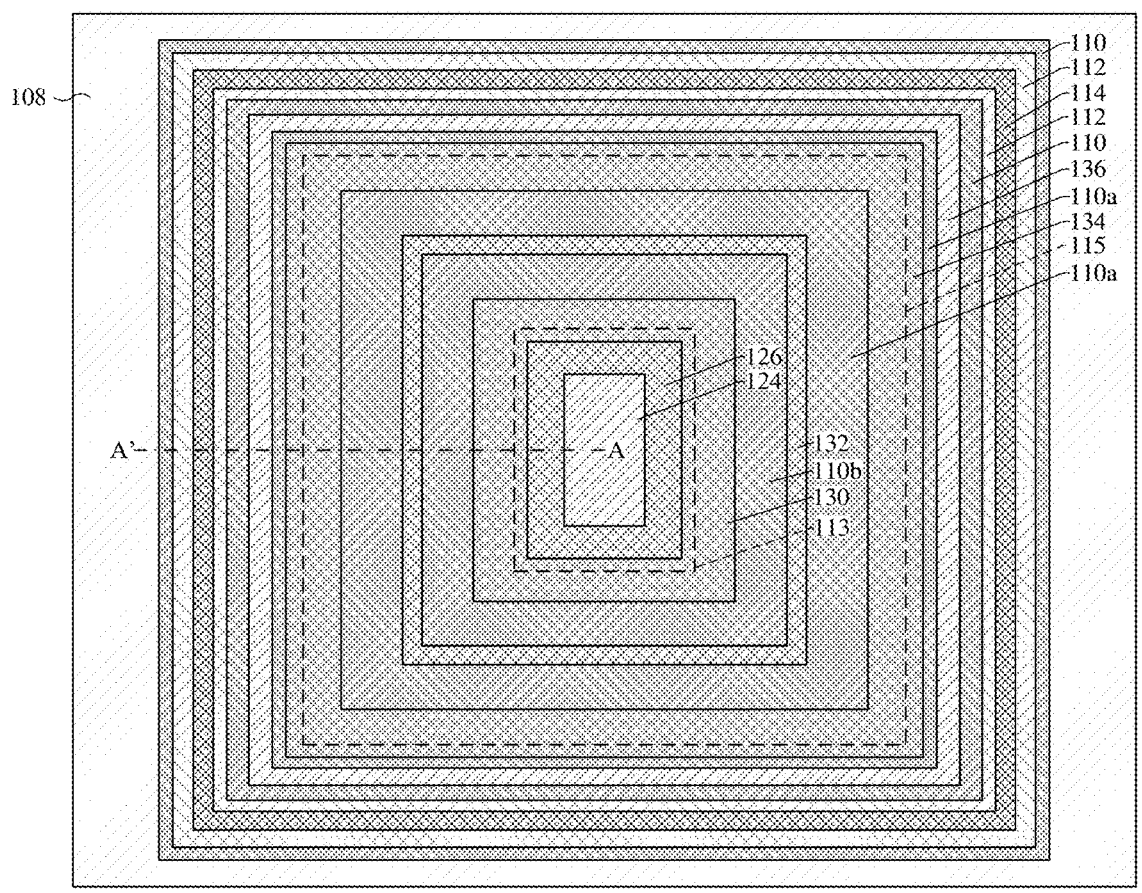

As shown in cross-sectional view 1000a and top view 1000b of FIGS. 10A-10B, one or more ion implantation processes are performed on the device substrate 108 to define doped regions within the device substrate 108, and define a high voltage transistor 122 and a conductive termination structure 121 on the device substrate 108. In some embodiments, the one or more ion implantation process are performed to form a body contact region 124, a source region 126, and a lightly doped region 202 within the first well region 116, a drain region 132 within the second well region 118, and a contact region 136 within the third well region 120. In some embodiments, the source region 126, the lightly doped region 202, and the drain region 132 comprise the first doping type (e.g., p-type), and the contact region 136 and the body contact region 124 comprise the second doping type (e.g., n-type). In further embodiments, the one or more ion implantation processes may each include: forming a masking layer (not shown) over the top surface of the device substrate 108; selectively implanting dopants into the device substrate 108; and performing a removal process to remove the masking layer. In yet further embodiments, a first ion implantation process may be performed to form the lightly doped region 202, a second ion implantation process may be performed to form the drain region 132 and the source region 126, and a third ion implantation process may be performed to form the contact region 136 and the body contact region 124. In some embodiments, as seen in FIG. 10B, the one or more ion implantation processes are performed such that the source region 126, the drain region 132, and/or the contact region 136 are ring-shaped regions.

The high voltage transistor 122 includes the gate electrode 130, the gate dielectric layer 128, the source region 126, and the drain region 132. In various embodiments, a process for forming the high voltage transistor 122 includes at least a portion of the processing steps illustrated and/or described in FIGS. 7A-11B. The conductive termination structure 121 includes the conductive gate electrode 134, the peripheral gate dielectric layer 133, and the contact region 136. In some embodiments, a process for forming the conductive termination structure 121 includes at least a portion of the processing steps illustrated and/or described in FIGS. 7A-11B. In yet further embodiments, the high voltage transistor 122 may be formed concurrently with the conductive termination structure 121.

Figure 11A:
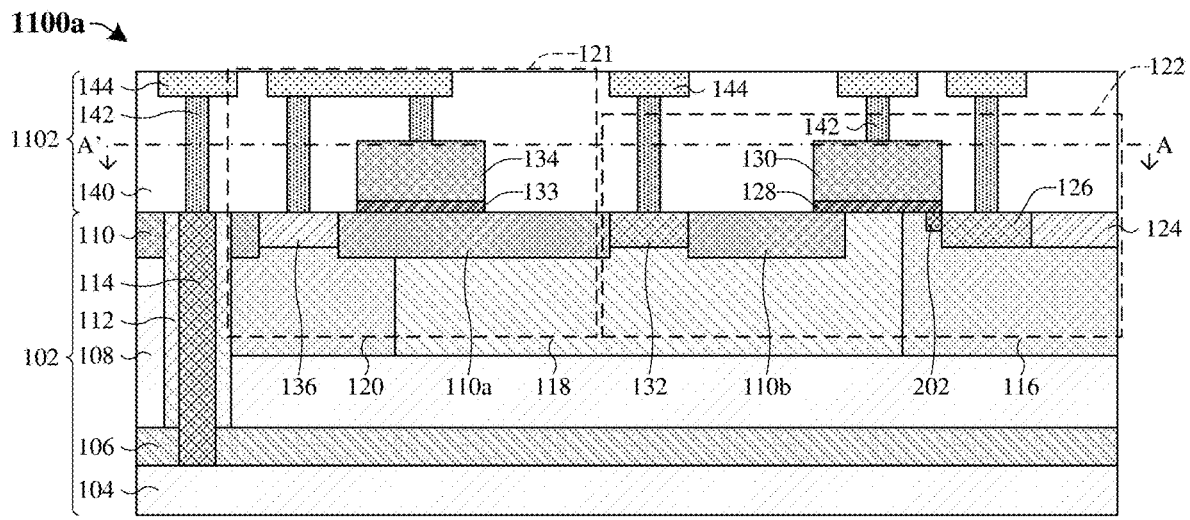
Figure 11B:
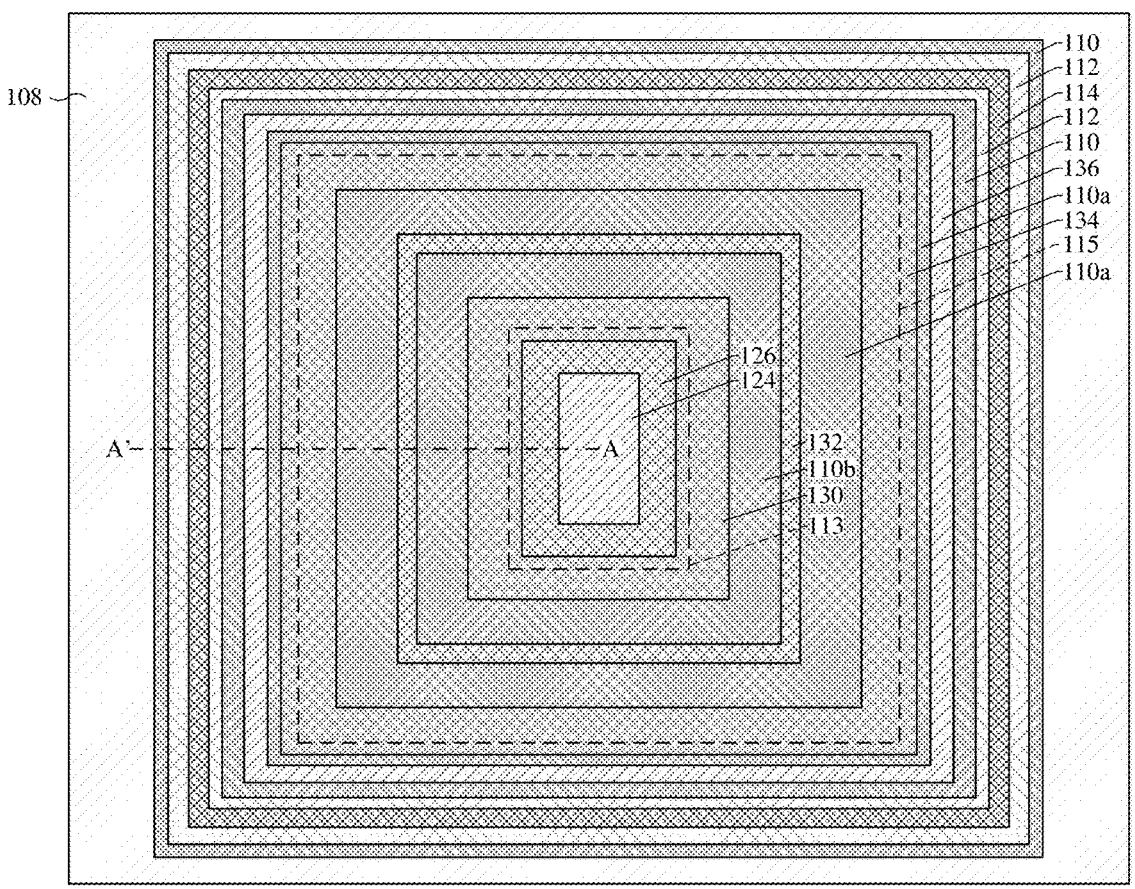

As shown in cross-sectional view 1100a and top view 1100b of FIGS. 11A-11B, an interconnect structure 1102 is formed over the device substrate 108. The interconnect structure 1102 includes a dielectric structure 140, a plurality of conductive contacts 142, and a plurality of conductive wires 144. In various embodiments, the dielectric structure 140 may be formed by a CVD process, a PVD process, an ALD process, or another suitable deposition or growth process. In further embodiments, the plurality of conductive contacts 142 and the plurality of conductive wires 144 may be formed by one or more patterning processes, one or more deposition processes, and/or other suitable fabrication processes. For clarity and ease of illustration, the dielectric structure 140 and the plurality of conductive contacts 142 are omitted from the top view of FIG. 11B.

Figure 12:
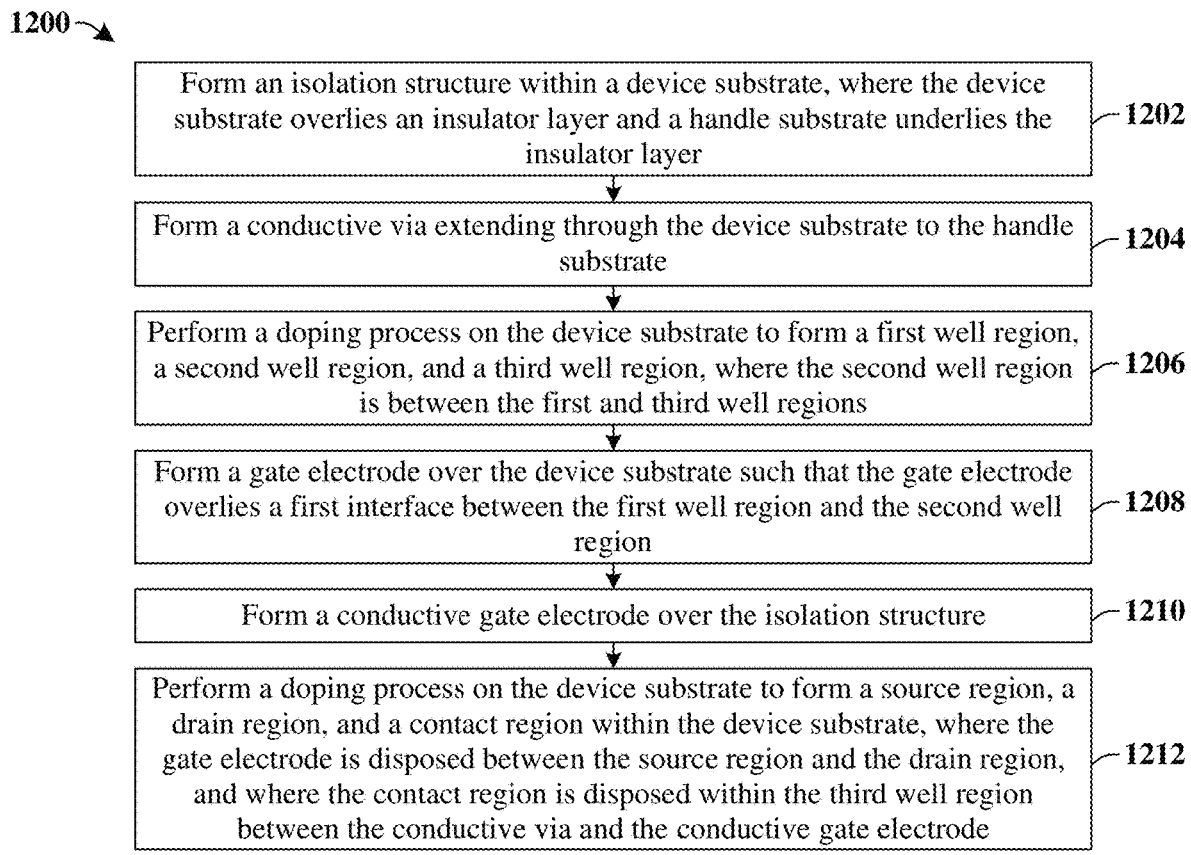
FIG. 12 illustrates a flowchart that illustrates some embodiments of a method for forming an integrated chip comprising a conductive termination structure disposed laterally adjacent to a high voltage transistor.

FIG. 12 illustrates a method 1200 for forming an integrated chip comprising a conductive termination structure disposed laterally adjacent to a high voltage transistor according to the present disclosure. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, an isolation structure is formed within a device substrate, where the device substrate overlies an insulator layer and a handle substrate underlies the insulator layer. FIGS. 6A-6B illustrate various views corresponding to some embodiments of act 1202.

At act 1204, a conductive via is formed extending through the device substrate to the handle substrate. FIGS. 7A-7B illustrate various views corresponding to some embodiments of act 1204.

At act 1206, a doping process is performed on the device substrate to form a first well region, a second well region, and a third well region, where the second well region is between the first and third well regions. FIGS. 8A-8B illustrate various views corresponding to some embodiments of act 1206.

At act 1208, a gate electrode is formed over the device substrate such that the gate electrode overlies a first interface between the first well region and the second well region. FIGS. 9A-9B illustrate various views corresponding to some embodiments of act 1208.

At act 1210, a conductive gate electrode is formed over the isolation structure. FIGS. 9A-9B illustrate various views corresponding to some embodiments of act 1210.

At act 1212, a doping process is performed on the device substrate to form a source region, a drain region, and a contact region within the device substrate. The gate electrode is disposed between the source region and the drain region, and the contact region is disposed within the third well region between the conductive via and the conductive gate electrode. FIGS. 10A-10B illustrate various views corresponding to some embodiments of act 1212.

Accordingly, in some embodiments, the present application relates to a high voltage transistor device disposed on a device substrate, where the device substrate is separated from an underlying handle substrate by an insulator layer. A conductive via extends through the device substrate to the handle substrate, and a conductive termination structure is disposed on the device substrate laterally between the high voltage transistor device and the conductive via.

In some embodiments, the present application provides an integrated chip, comprising: a semiconductor substrate comprising a device substrate overlying a handle substrate and an insulator layer disposed between the device substrate and the handle substrate; a gate electrode overlying the device substrate between a drain region and a source region; a conductive via extending through the device substrate and the insulator layer to contact the handle substrate; a first isolation structure disposed within the device substrate and comprising a first isolation segment disposed laterally between the gate electrode and the conductive via; a contact region disposed within the device substrate between the first isolation segment and the conductive via; and a conductive gate electrode directly overlying the first isolation segment, wherein the conductive gate electrode is electrically coupled to the contact region. In an embodiment, the integrated chip further comprises: a first well region disposed within the device substrate; a second well region disposed within the device substrate and adjoining the first well region at a first interface, wherein the second well region comprises a first doping type and the first well region comprises a second doping type opposite the first doping type, and wherein the gate electrode directly overlies the first interface; and a third well region disposed within the device substrate and adjoining the second well region at a second interface, wherein the third well region comprises the second doping type, and wherein the conductive gate electrode directly overlies the second interface. In an embodiment, the drain region is disposed within the second well region, the source region is disposed within the first well region, and the contact region is disposed within the third well region such that the conductive gate electrode is electrically coupled to the third well region by way of the contact region. In an embodiment, the source region and the drain region comprise the first doping type, and the contact region comprises the second doping type, the first doping type is p-type and the second doping type is n-type. In an embodiment, the first isolation segment continuously extends from a sidewall of the contact region to a sidewall of the drain region, and wherein the conductive gate electrode is spaced laterally between outer opposing sidewalls of the first isolation segment. In an embodiment, the conductive gate electrode is ring-shaped and laterally encloses the drain region and the gate electrode. In an embodiment, the contact region is ring-shaped such that the contact region encompasses the conductive gate electrode. In an embodiment, the integrated chip further includes a second isolation structure disposed within the device substrate and laterally enclosing the conductive via, wherein the second isolation structure continuously extends from a top surface of the device substrate to a top surface of the insulator layer. In an embodiment, the integrated chip further includes an interconnect structure overlying the device substrate, wherein the interconnect structure includes a plurality of conductive contacts and a plurality of conductive wires disposed within a dielectric structure, wherein the conductive gate electrode is coupled to the contact region by way of the conductive contacts and conductive wires.

In some embodiments, the present application provides an integrated chip, comprising: a device substrate overlying an insulator layer and a handle substrate underlying the insulator layer; a first well region, a second well region, and a third well region disposed within the device substrate, wherein the second well region is spaced laterally between the first and third well regions; a high voltage transistor disposed on the device substrate comprising a gate electrode, a source region, and a drain region, wherein the gate electrode is disposed between the source region and the drain region, wherein the gate electrode directly overlies a first interface between the first well region and the second well region; a conductive via disposed within the device substrate and electrically coupled to the handle substrate, wherein the conductive via is adjacent to the third well region; and a conductive termination structure disposed on the device substrate between the conductive via and the high voltage transistor, wherein the conductive termination structure comprises a contact region disposed within the third well region and a conductive gate electrode overlying a second interface between the second well region and the third well region, wherein the conductive gate electrode is electrically coupled to the third well region by way of the contact region. In an embodiment, the integrated chip further includes a first isolation structure disposed within the device substrate, wherein the first isolation structure comprises a first isolation segment laterally offset from a second isolation segment, wherein the first isolation segment separates the conductive gate electrode from the device substrate, and wherein the gate electrode directly overlies at least a portion of the second isolation segment. In an embodiment, the integrated chip further includes a peripheral gate dielectric layer disposed between the conductive gate electrode and the first isolation segment, wherein a top surface of the first isolation segment directly contacts an entirety of a bottom surface of the peripheral gate dielectric layer. In an embodiment, the contact region adjoins an outer sidewall of the first isolation segment, wherein opposing outer sidewalls of the conductive gate electrode are laterally offset from the outer sidewall of the first isolation segment in a direction towards the high voltage transistor. In an embodiment, the gate electrode and the conductive gate electrode are ring-shaped and concentric with respect to one another. In an embodiment, the conductive via is ring-shaped and laterally wraps around an outer perimeter of the conductive termination structure. In an embodiment, the contact region and the third well region comprise a same doping type.

In some embodiments, the present application provides a method for manufacturing an integrated chip, including: forming a first isolation structure in a device substrate, wherein the device substrate overlies an insulator layer and a handle substrate underlies the insulator layer; forming a conductive via extending through the device substrate to the handle substrate; doping the device substrate to form a first well region, a second well region, and a third well region within the device substrate, wherein the second well region is spaced laterally between the first and third well regions; forming a gate electrode over the device substrate such that the gate electrode overlies a first interface between the first well region and the second well region; forming a conductive gate electrode over the first isolation structure; and doping the device substrate to form a source region, a drain region, and a contact region within the device substrate, wherein the gate electrode is disposed between the source region and the drain region, and wherein the contact region is disposed within the third well region between the conductive via and the conductive gate electrode. In an embodiment, the method further includes forming an interconnect structure over the device substrate and comprising a plurality of conductive contacts and a plurality of conductive wires disposed within a dielectric structure, wherein the conductive gate electrode is electrically coupled to the contact region by way of the interconnect structure. In an embodiment, the contact region abuts an outer sidewall of the first isolation structure, wherein the conductive gate electrode is laterally offset from the outer sidewall of the first isolation structure by a non-zero distance. In an embodiment, the method further includes forming a second isolation structure in the device substrate, wherein the second isolation structure extends from a top surface of the device substrate to the insulator layer, and wherein the second isolation structure laterally encloses the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrate chip, the method comprising:
forming a first isolation structure in a device substrate, wherein the device substrate overlies an insulator layer and a handle substrate underlies the insulator layer;
forming a conductive via extending through the device substrate to the handle substrate;
doping the device substrate to form a first well region, a second well region, and a third well region within the device substrate, wherein the second well region is spaced laterally between the first and third well regions;
forming a gate electrode over the device substrate such that the gate electrode overlies a first interface between the first well region and the second well region;
forming a conductive gate electrode over the first isolation structure; and
doping the device substrate to form a source region, a drain region, and a contact region within the device substrate, wherein the gate electrode is disposed between the source region and the drain region, and wherein the contact region is disposed within the third well region between the conductive via and the conductive gate electrode.

2. The method of claim 1, further comprising:
forming an interconnect structure over the device substrate and comprising a plurality of conductive contacts and a plurality of conductive wires disposed within a dielectric structure, wherein the conductive gate electrode is electrically coupled to the contact region by way of the interconnect structure.

3. The method of claim 1, wherein the contact region abuts an outer sidewall of the first isolation structure, wherein the conductive gate electrode is laterally offset from the outer sidewall of the first isolation structure by a non-zero distance.

4. The method of claim 1, further comprising:
forming a second isolation structure in the device substrate, wherein the second isolation structure extends from a top surface of the device substrate to the insulator layer, and wherein the second isolation structure laterally encloses the conductive via.

5. The method of claim 1, wherein a segment of the first isolation structure continuously extends from a sidewall of the contact region to a sidewall of the drain region, and wherein the conductive gate electrode is spaced laterally between opposing sidewalls of the segment of the first isolation structure.

6. The method of claim 1, wherein the conductive gate electrode is ring-shaped and laterally encloses the drain region and the gate electrode.

7. The method of claim 6, wherein the contact region is ring-shaped and laterally wraps around the conductive gate electrode.

8. The method of claim 1, wherein the first well region and the third well region comprise a first doping type, wherein the second well region comprises a second doping type opposite the first doping type, wherein the conductive gate electrode directly overlies a second interface between the second well region and the third well region.

9. The method of claim 8, wherein the drain region comprises the second doping type and is disposed within the second well region, wherein the source region comprises the second doping type and is disposed within the first well region.

10. A method for forming an integrated chip, the method comprising:
forming a first isolation structure within a semiconductor substrate, wherein the semiconductor substrate comprises a device substrate overlying a handle substrate, wherein the first isolation structure comprises a first isolation segment in the device substrate;
forming a conductive via adjacent to the first isolation segment and extending from the device substrate to the handle substrate;
forming a first gate structure over the device substrate;
performing a doping process on the device substrate to form a source region, a drain region, and a contact region within the device substrate, wherein the source region is adjacent to the first gate structure, wherein the drain region is between the first gate structure and the first isolation segment, and wherein the contact region is between the conductive via and the first isolation segment; and
forming a second gate structure directly over the first isolation segment.

11. The method of claim 10, wherein forming the conductive via comprises:
etching the semiconductor substrate to form a trench extending from a top surface of the device substrate to the handle substrate;
depositing a conductive material within the trench; and
performing a planarization process on the conductive material.

12. The method of claim 10, wherein the first gate structure and the second gate structure are formed concurrently with one another.

13. The method of claim 10, wherein the second gate structure comprises a gate electrode overlying a gate dielectric layer, wherein an upper surface of the first isolation segment directly contacts an entirety of a bottom surface of the gate dielectric layer.

14. The method of claim 10, wherein a sidewall of the second gate structure facing the conductive via is laterally offset from a sidewall of the first isolation segment in a direction away from the conductive via.

15. The method of claim 10, further comprising:
forming an interconnect structure on the semiconductor substrate, wherein the interconnect structure comprises conductive structures directly electrically coupling the contact region to the second gate structure.

16. The method of claim 10, wherein a width of the second gate structure is less than a width of the first isolation segment.

17. A method for forming an integrated chip, comprising:
doping a device substrate to from a first well region, a second well region, and a third well region in the device substrate, wherein a handle substrate underlies the device substrate and an insulator layer is disposed between the device substrate and the handle substrate, wherein the second well region is laterally between the first and third well regions;
forming a conductive via within the device substrate and laterally adjacent to the third well region, wherein the conductive via contacts the handle substrate;
forming a high voltage transistor on the device substrate, wherein the high voltage transistor comprises a first gate electrode, a source region, and a drain region, wherein the first gate electrode directly overlies a first interface between the first well region and the second well region; and forming a termination structure on the device substrate between the conductive via and the high voltage transistor, wherein the termination structure comprises a second gate electrode directly overlying a second interface between the second well region and the third well region.

18. The method of claim 17, further comprising:

forming a first isolation structure in the device substrate, wherein the first isolation structure comprises a first isolation segment and a second isolation segment, wherein the first isolation segment is disposed between the conductive via and the first gate electrode, wherein the second isolation segment is disposed between the source region and the drain region, wherein the first gate electrode directly overlies at least a portion of the second isolation segment.

19. The method of claim 18, further comprising:

forming a second isolation structure within the device substrate and along sidewalls of the conductive via, wherein a height of the second isolation structure is equal to a height of the device substrate.

20. The method of claim 17, wherein the termination structure comprises a contact region disposed within the third well region between the second gate electrode and the conductive via.

* * * * *